(12) United States Patent
Perino et al.

(10) Patent No.: US 6,854,030 B2
(45) Date of Patent: Feb. 8, 2005

(54) INTEGRATED CIRCUIT DEVICE HAVING A CAPACITIVE COUPLING ELEMENT

(75) Inventors: Donald V. Perino, Los Altos, CA (US); Haw-Jyh Liaw, Fremont, CA (US); Alfredo Moncayo, Redwood City, CA (US); Kevin Donnelly, Los Altos, CA (US); Richard M. Barth, Palo Alto, CA (US); Bruno W. Garlepp, Sunnyvale, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 10/287,100

(22) Filed: Nov. 4, 2002

(65) Prior Publication Data

US 2003/0105908 A1 Jun. 5, 2003

Related U.S. Application Data

(63) Continuation of application No. 09/398,251, filed on Sep. 17, 1999, now Pat. No. 6,496,889.

(51) Int. Cl.$^7$ ............................................. G06F 13/14
(52) U.S. Cl. ..................................... 710/110; 710/305
(58) Field of Search ............................... 710/305, 110; 375/275

(56) References Cited

U.S. PATENT DOCUMENTS

| | | | | |
|---|---|---|---|---|
| 3,593,207 A | * | 7/1971 | Woermbke et al. ......... | 333/116 |
| 3,619,504 A | | 11/1971 | DeVeer | |
| 3,671,868 A | * | 6/1972 | Sanders .................... | 455/170.1 |
| 3,781,716 A | * | 12/1973 | Gerst et al. ................. | 332/105 |
| 4,216,446 A | * | 8/1980 | Iwer ........................... | 333/112 |
| 4,234,952 A | | 11/1980 | Gable et al. | |
| 4,273,428 A | * | 6/1981 | Borowski et al. .......... | 396/167 |

(List continued on next page.)

FOREIGN PATENT DOCUMENTS

| | | | | |
|---|---|---|---|---|
| JP | 60107901 A | * | 6/1985 | ............. H01P/1/00 |
| JP | 09294025 A | * | 11/1997 | ............. H03F/1/00 |

OTHER PUBLICATIONS

Deutsch et al, "When are Transmission–line Effects Important for On–chip Interconnections?" Oct. 1997, IEEE Transactions on microwave theory and techniques, vol. 45, pp. 1836–1846.*

Bhattacharya et al, "Empirical Relations for Capacitive and Inductive Coupling Coefficients of Coupled Microstip lines" Apr. 1981, IEEE Transactions on microwave theory and techniques, vol. 4, pp. 386–388.*

Lowther et al, "Substrate Parasitics and Dual–resistivity Substrates" Jul. 1996, IEEE Transactions on microwave theory and techniques, vol. 44, pp. 1170–1174.*

T. Knight Jr. et al., "Capacitive Coupling Solves the Known Good Die Problem", Proc. 1994 IEEE Multi–chip Module Conference, pp. 95–101, (Mar. 1994).

T. Knight, Jr et al., "Manufacturability of Capacitively Coupled Multichip Modules", IEEE Transactions On Components, Packaging, And Manufacturing Technology—Part B vol. 18, No. 2, (May 1995).

(List continued on next page.)

*Primary Examiner*—Paul R. Myers
(74) *Attorney, Agent, or Firm*—Vierra Magen Marcus Harmon & DeNiro LLP

(57) ABSTRACT

An integrated circuit memory device that include an input receiver, an output driver, and a capacitive coupling element. The capacitive coupling element includes a first capacitor electrode and a second capacitor electrode. The first capacitor electrode is coupled to the input receiver and the output driver, an the second capacitor electrode couples to an external signal line. Delay modulated data is received by the input receiver from the external signal line via the capacitive coupling element.

10 Claims, 19 Drawing Sheets

U.S. PATENT DOCUMENTS

| | | | | |
|---|---|---|---|---|
| 4,280,221 | A | * 7/1981 | Chun et al. | 375/288 |
| 4,298,930 | A | 11/1981 | Haubner et al. | |
| 4,376,921 | A | * 3/1983 | Dickens et al. | 333/116 |
| 4,725,836 | A | 2/1988 | Guidos | |
| 4,794,620 | A | 12/1988 | Moore et al. | |
| 5,068,630 | A | 11/1991 | Gris | |
| 5,170,140 | A | * 12/1992 | Lowe et al. | 333/157 |
| 5,189,432 | A | 2/1993 | Lombardi et al. | |
| 5,243,305 | A | * 9/1993 | D'Oro et al. | 333/116 |
| 5,365,205 | A | 11/1994 | Wong | |
| 5,621,913 | A | 4/1997 | Tuttle et al. | |
| 5,638,402 | A | 6/1997 | Osaka et al. | |
| 5,907,251 | A | 5/1999 | Houghton | |
| 6,496,889 | B1 | * 12/2002 | Perino et al. | 710/110 |
| 6,500,696 | B2 | 12/2002 | Sutherland | |
| 6,559,531 | B1 | 5/2003 | Sutherland | |
| 6,728,113 | B1 | 4/2004 | Knight et al. | |

OTHER PUBLICATIONS

T. J. Gabara, "Capacitive Coupling And Quantized Feedback Applied to Conventional CMOS Technology", IEEE Journal of Solid State Circuits, vol. 32, No. 3, (Mar. 1997).

K. Hoffman et al., "High Speed Capacitive Coupled Interface for Multipoint Connections", Proc. 1994 IEEE Multi-chip Module Conference, pp. 95–101, (Mar. 1994).

L. A. Hayden, "Pulse Signaling Using Capacitively-Coupled CMOS", IEEE publication (1994).

T. Knight, Jr. et al. "Application of Capacitive Coupling to Switch Fabrics", IEEE publication (1994).

H. Osaka et al., "IGT/s Back Plane (XTL: Crosstalk Transfer Logic) using Crosstalk Mechanism", Hot Interconnects A Symposium on High Performance Interconnects, pp. 141–147, (Aug. 1997).

* cited by examiner

INTEGRATED CIRCUIT DEVICE HAVING A CAPACITIVE COUPLING ELEMENT This is a continuation of application Ser. No. 09/398,251 filed on Sep. 17, 1999 (now U.S. Pat. No. 6,496,889).

BACKGROUND OF THE INVENTION

This invention relates to a chip-to-chip communication system. Chip-to-chip communication systems facilitate interactions between a number of devices. Typically the devices communicate with each other via a bus or a plurality of signal lines.

The term "chip-to-chip" refers to any implementation where a number of devices are inter-coupled together. The term "device(s)" is used to refer to one or more integrated circuits or cards which may include synchronous dynamic random access memories (SDRAM), double data rate (DDR) memories, micro-controllers, processors, memory modules, modem cards, and video cards, just to name a few. A memory system and computer system are ready examples of a chip-to-chip communication system formed from an inter-coupled group of integrated circuits or cards. The usage of the term "bus" refers to any arrangement of a plurality of conducting medium used to transport information between devices. Such conducting medium may be implemented in one of many ways including wires in a flex tape or patterned conducting lines on a printed circuit board, etc. For our purposes, one of a conducting medium used in a bus of a chip-to-chip communication system will hereinafter be referred to as a "signal line."

Thus, in keeping with the foregoing, an example of a conventional chip-to-chip communication system is illustrated in FIG. 1. Here, chip-to-chip communication system 10 includes master device 20 and a plurality of slave devices 30a to 30n, coupled by at least one signal line 40. In this example, the master device 20 may be any device capable of communicating with one or more other master devices (not illustrated) or with slave devices 30. Typically, slave devices 30a–n only respond to commands given by master device 20, and do not communicate with each other. More specific examples of chip-to-chip communication systems include a memory system having a controller directing interactions with a number of memory devices over a bus, or a computer system having a mother board with a central processing unit (CPU) communicating with a number of peripheral device cards.

One common class of slave devices includes memory devices, such as dynamic random access memory (DRAM). Such devices are characterized by limited access speeds. Access speeds for conventional DRAMs have significantly lagged behind the operating speeds pioneered in conventional CPUs. Thus, designers face a constant challenge in the development of memory systems having sufficiently high data throughput to fully utilize CPU performance capability.

With reference to FIG. 2, a chip-to-chip communication system implemented as a conventional memory system 45 is illustrated. Here, a controller 50 and a number of memory devices 60 are disposed on a circuit board (not illustrated). The memory devices 60 are directly coupled in parallel to the controller 50 over a wide bus 70. In this example, each memory device 60 has a dedicated portion of signal lines 80 directly coupled to the controller 50. In more detail, each memory device 60 is coupled to eight signal lines and all sixty four signal lines of wide bus 70 are coupled to controller 50.

It is well known that by utilizing this parallel approach to couple memory devices to the controller, the data throughput of the chip-to-chip communication system 45 may be improved. However, the width of the bus is limited by physical constraints, i.e., the available space and layout area of the circuit board. Thus, achieving additional data throughput by widening the bus (i.e., increasing the number of signal lines) has a maximum feasible limit.

Many different techniques have been employed in attempts to increase the data throughput of the conventional memory system. One attempt uses a relatively narrow bus and faster information transfer rates. "Information" in this context refers broadly to data, control and/or address information.

With reference to FIG. 3, a chip-to-chip communication system employing a relatively narrow bus is shown. In this example, a plurality of memory devices 105, are directly coupled to a controller 110 via narrow bus 115. Bus 115 comprises relatively few signal lines as compared to the parallel architecture of FIG. 2. This later conventional approach does not utilize a parallel architecture to achieve high data throughput. Thus, physical constraints tend to be less of a concern. Rather, in this conventional approach, controller 110 and memory devices 105 incorporate high speed interfaces. Here, high data throughput is achieved by transferring information between the controller and the memory devices at high transfer rates.

As information transfer rates are increased over a signal line, difficulties arise which impose a practical upper limit on these higher rates. With reference to FIG. 4A, a chip-to-chip communication system is shown having a signal line 220 coupling a plurality of devices 230a to 230c. The plurality of devices 230a to 230c are "directly coupled" to the signal line 220 at locations 240a to 240c. Two adjacent locations 240a and 240b span distance "d" to define a plurality of line segment 210a to 210d. Each line segment 210a–d may represent a common pitch between devices 230a to 230c. The term "directly coupled" refers to an electrical connection between a plurality of input/output (I/O) interface circuits 242a to 242c and signal line 220.

In this example, one line segment 210 is a conductor which may be modeled by electrical elements as shown in line segment model 250. The elements in the line segment model 250 describe the electrical behavior of each signal line segment. This electrical behavior is practically unnoticeable and therefore irrelevant at lower information transfer rates but becomes more significant to system performance as rates are increased. It is known to those skilled in the art that disposing a plurality of devices at equidistant points along a signal line causes the signal line to behave as multi pole low pass filter.

As the length "d" of the line segments 210a–d is decreased, the effective maximum operation frequency decreases. With reference to FIG. 4B, a representational graph of the signal line frequency response of the conventional chip-to-chip communication system with respect to three device I/O spacings is illustrated. Graph 410 depicts signal amplitude over a range of effective operation frequencies for signal line 220 (FIG. 4A) as a function of three device spacings $d_1$, $d_2$, and $d_3$. Graph 410 illustrates three decreasing device I/O spacings $d_1$, $d_2$, and $d_3$ and correspondingly decreasing cutoff frequency curves 412, 414, and 416.

With further reference to FIG. 4A, a plurality of "interface conductors" 255a to 255c typically couples each of interfaces 242a to 242c on devices 230a to 230c and signal line 220. The term "interface conductor" denotes all structures coupled to interfaces 242a to 242c and the signal line at location 240a to 240c. For example, interface conductors 255a–c might include bond wires, pins, modules or circuit card connectors, ball bonds, bond pads, electrostatic discharge protection devices, driver and receiver circuits and related interconnects. The interface conductors 255a–c, similar to the line segments 210a–d, may be modeled using electrical elements as shown in an interface conductor model 260. The electrical elements in interface conductor model 260 generally describe electrical behavior associated with the interface conductor 255.

When operating at high data transfer rates, the electrical behavior of the system depends, to a significant extent, upon the practical and physical attributes of the line segments 210 and the interface conductors 255. Here, the line segment model 250, includes inductive component 265, capacitive components 270 and resistive components 275. Interface conductor model 260 includes inductive component 280, capacitive component 285 and resistive component 290. It is well known by those skilled in the art that components such as the resistive components 290 and 275 introduce losses. The term "losses" may be used to describe mechanisms by which information transfer is not efficiently executed. Losses impose a limit on the rate at which the information may be reliably transferred. The magnitude of these losses are a function of the information transfer rate. As the information transfer rate is increased, losses also increase.

Interface conductor model 260 includes inductive component 280, capacitive component 285 and resistive component 290. These elements are directly coupled to the signal line 220 and, thus, become effectively "part" of signal line 220. Losses resulting from resistive component 290 increase as more devices are coupled to the bus.

With reference to FIG. 4A and FIG. 4C, a representational graph of the signal frequency response of the conventional chip-to-chip communication system with respect to three levels of dissipative loss is illustrated. Sources of dissipative loss include printed circuit board substrate, skin effect resistance of metal traces of the signal lines, and input resistance seen at the device I/O. Graph 420 indicates signal amplitude over a range of effective operation frequencies for signal line 220 (FIG. 4A) as a function of different quantities of dissipative loss. In the conventional chip-to-chip communication system, cutoff frequency decreases as the amount of dissipative loss decreases.

The capacitive component 285 plays a role in limiting the maximum useful information transfer rate. As the device input capacitance $C_1$ of capacitive component 285 is decreased, the maximum effective information transfer rate supported by the signal line increases. A representational graph of the signal frequency response of the conventional chip-to-chip communication system with respect to three device input capacitances is illustrated in FIG. 4D. Device input capacitance $C_1$ is inherent in elements of the I/O structures disposed on each device. These elements include, for example, bond pads, electrostatic discharge devices, input buffer transistor capacitance, and output driver transistor parasitic and interconnect capacitances relative to the device substrate. Typically, the input capacitance is present between a ground potential (not shown) and the signal line. Graph 430 depicts signal amplitude over a range of effective operation frequencies for signal line 220 (FIG. 4A) as a function of three input capacitances $C_1$, $C_2$, and $C_3$ (where $C_1 < C_2 < C_3$). In the conventional chip-to-chip communication system, cutoff frequency decreases as the device input capacitance decreases. Graph 430 illustrates the three input capacitances $C_1$, $C_2$, $C_3$ and correspondingly decreasing cutoff frequency curves 432, 434, and 436.

As a result, the components of the interface conductor model adversely effect the maximum rate of information transfer. Here, as the information transfer rate increases, the magnitude of the losses associated with these components increases accordingly. The losses associated with these components impose an effective maximum information transfer rate limit.

In the conventional chip-to-chip communication system of FIG. 2, a parallel approach was used to achieve high data throughput. The information transfer rate in such systems tended to be too low for the loss components of the foregoing models to have any adverse effect on system performance.

In the narrow bus approach, the information transfer rate is increased relative to the information transfer rate employed in the parallel approach. The inductive, capacitive and resistive components in the interface conductor model and line segment model become more significant in determining the reliability of information transfer when the information transfer rate is increased. The resistive components in the interface and line segment models tend to degrade the integrity of the information in some proportion to the rate of information transfer.

One attempt to address the issue of increasing the speed of a data communications network, is described in U.S. Pat. No. 3,619,504. This patent describes a high speed network which employs coupling elements to couple information between a transmission line and receiver circuit. The coupling elements induce currents in "stub" lines which are terminated by a resistor. In operation, a voltage transition propagates down the transmission line and induces a current (in the opposite direction) in a stub line of each coupling element. An inductive coupling technique and associative circuit are employed to couple information between the transmission line and receiver circuit. The inductive coupling technique typically requires a stub line having a suitable length to facilitate current induction via the coupling element. This tends to impose a physical limit upon the interface between the receiver circuit and the transmission line and may be unsuitable for applications requiring tight space requirements. Thus, the inductive coupling technique may be limited by a minimum pitch requirement between adjacent receiver circuits due to the length of the stub line in each coupling element.

In sum, conventional chip-to-chip communication systems have employed a parallel approach to increase information throughput. However, use of this parallel approach is severely limited by space constraints. To overcome the limitations of the parallel approach, some conventional chip-to-chip communication systems have employed a narrow bus approach in which a high speed interface is incorporated into the devices. Here, high throughput is achieved by a high rate of information transfer. However, as the information transfer rate increases; inductive, capacitive and resistive components become significant limiting factors to the effective transfer of information. As the information transfer rate is increased, the magnitude of these components increases. This tends to impose an upper limit on the information transfer rate. In the conventional chip-to-chip communication system, the maximum effective operation frequency (or cutoff frequency) decreases as the pitch between adjacent device I/O are decreased. An inductive coupling technique may be viable towards increasing the effective information transfer rate in a chip-to-chip communication, but a minimum pitch requirement may be imposed between adjacent devices due to the required length of stub lines to effectuate inductive coupling.

Accordingly, there is a need to minimize the impact of losses resulting from the resistive component of the interface conductor model. Resistive components, inductive components, and capacitive components increasingly limit the reliability of information transfer as the information transfer rate is increased.

There is a need to provide circuits and techniques for increasing the effective information transfer limit beyond present maximum information transfer rates in conventional chip-to-chip communication systems. By increasing the maximum rate of information transfer further, data throughput may be increased, and higher system performance realized.

SUMMARY OF THE INVENTION

The present invention relates to circuitry and techniques for a chip-to-chip communication system, such as, a memory system. The circuitry of the present invention utilizes a capacitively coupled interface technique which allows the system to transfer information at a high data rate.

In one aspect, the present invention is a chip-to-chip system which includes a master device (e.g., a memory controller), a first slave device (e.g., a memory device) coupled to a signal line and a second slave device (e.g., a memory device) coupled to the signal line. An input receiver is included on each slave device to receive data on the signal line. The system also includes a first capacitive coupling element, disposed between the input receiver of the first slave device and the first signal line and a second capacitive coupling element, disposed between the input receiver of the second slave device and the first signal line. The capacitive coupling elements electrically couple the respective input receivers to the signal lines to receive data on the bus. Here, the capacitive coupling element may be an integrated capacitor, a discrete capacitor, a microwave coupler or included in a diode configuration.

In another aspect, the present invention is an integrated circuit device having an input receiver and a diode element. The diode element is disposed between the input of the input receiver and an external signal line. The diode element capacitively couples data on the external signal line to the input receiver. Here, the diode element operates in a reverse bias state when the integrated circuit device receives data on the external signal line.

In this aspect of the invention, the integrated circuit device may also include an output driver having an output. The diode device is disposed between the output of the output driver and the external signal line. The diode element may be a forward biased diode device when the integrated circuit device provides data on the external signal line.

Under the circumstances the output driver is a push-pull type driver, the diode element may include a first diode device having an anode coupled to the external signal line and a cathode coupled to the output of the output driver and a second diode device having an anode coupled to the output of the output driver and a cathode coupled to the external signal line.

The present invention is described in the detailed description to follow. It should be understood that the detailed description and specific examples are given by way of illustration only. Various modifications to the specific examples remain within the scope of the invention which is defined by the attached claims. For example, the slave device may be one of a number of different types of integrated circuit devices, each integrated circuit device having a capacitive coupling element provided to transfer information to a signal line. In addition the capacitive coupling elements themselves may take alternate forms in which a capacitance is provided between the interface circuitry of a slave device and the signal line.

BRIEF DESCRIPTION OF THE DRAWINGS

In the course of the detailed description to follow, reference will be made to the attached drawings in which:

FIG. 4D is a representational graph of the signal frequency response of the conventional chip-to-chip communication a tern with respect to three device input capacitances;

DETAILED DESCRIPTION

The present invention relates to a chip-to-chip communication system and associative interface techniques and circuits. In one example, the chip-to-chip communication system may be a memory system. In a chip-to-chip communication system according to the present invention, a capacitive coupling element is employed to facilitate high rates of information transfer between a master device and slave device(s).

The present invention provides circuitry which may substantially increase the maximum rate of information transfer as compared to those in conventional chip-to-chip communication systems. By increasing the maximum rate of information transfer, data throughput is increased, and a higher system performance is realized. To this end, the present invention minimizes losses resulting from resistive components seen in the conventional chip-to-chip communication system interface conductor model.

In one embodiment, a chip-to-chip communication system includes a master device, and a slave device coupled to a signal line. For example, the chip-to-chip communication system may include a memory controller and one or more memory devices. An interface, such as an input receiver and/or an output buffer is included on the slave device. A capacitive coupling element is disposed between the interface and the signal line. The capacitive coupling element decreases losses which a conventional slave interface would otherwise present to the signal line. By reducing the effect of these losses, signal line performance is optimized to support much higher rates of information transfer between the master device and slave device. In addition, the reduction of these losses may allow more devices to be coupled to the signal line. By coupling more devices to the signal line, the performance of the chip-to-chip communication system may be significantly enhanced.

Figure 5A:
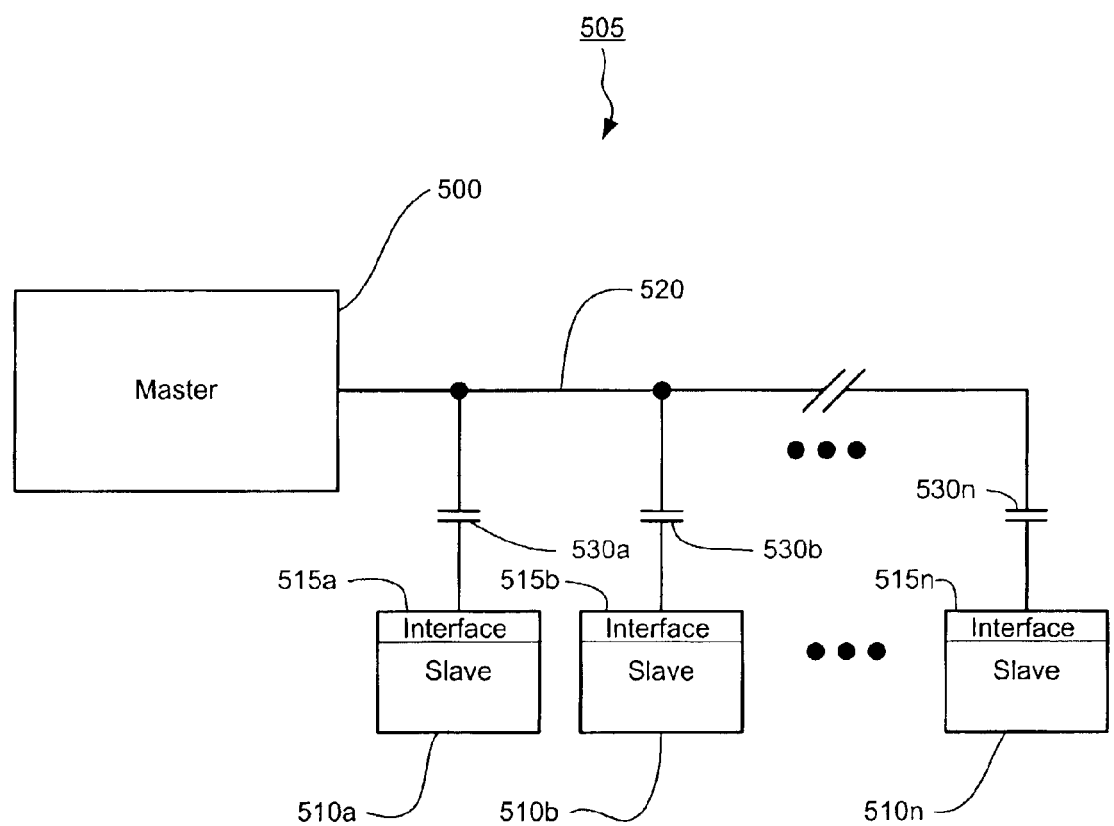
FIG. 5A is a schematic block diagram representation of a chip-to-chip communication system according to an embodiment of the present invention.

With reference to FIG. 5A, a chip-to-chip communication system is shown in accordance to a specific embodiment of the present invention. Here, a master device 500, is disposed in chip-to-chip communication system 505 to transfer information with a plurality of slave devices 510a to 510n. A plurality of input/output (I/O) interface circuits 515a to 515n corresponding to each slave device 510a–510n are capacitively coupled to signal line 520 via corresponding capacitive coupling elements 530a to 530n. Although only one signal line 520 is shown, chip-to-chip communication system 505 would likely include a plurality of signal lines coupled in parallel. In this case, additional capacitive coupling elements may be disposed to provide capacitive coupling. Moreover, although a plurality of slave devices 510a to 510n are illustrated, only one slave device is necessary to communicate with master 500.

In one operating mode, at least one of slave devices 510a–n communicates to the master device 500 by coupling (transmitting) information onto the bus to be received by the master device 500. This will hereinafter be referred to as a slave transmit mode. For example, a read operation utilizes the slave transmit mode and depicts a cycle where information or data is requested by the master (e.g., a controller) and provided by the slave (e.g., a memory device) to the master device via the signal line.

In another operating mode, the master device 500 transmits information, via signal line 520, to one or more of slave device 510a–n. This particular mode will hereinafter be referred to as a slave receive mode. For example, a write operation may utilize a slave receive mode and depicts a cycle where information is provided by the master onto the bus and consequentially accepted by the slave.

The capacitive coupling elements 530a–n may be incorporated on slave devices 510a–n and, for example, may be an integrated circuit capacitor (e.g., a MOS capacitor). Alternatively, capacitive coupling elements 530a–n may be disposed external to the slave devices 510a–n and, for example, may comprise discrete external capacitor devices.

Figure 5C:
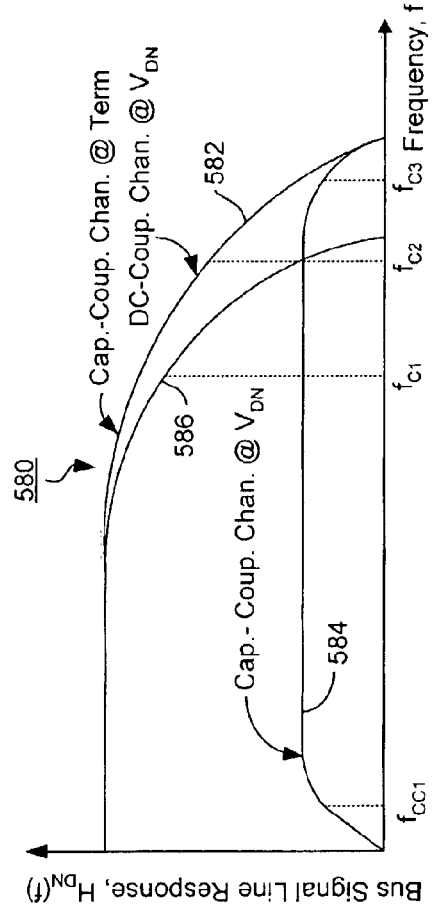
FIG. 5C is a graph representing the frequency response of master to slave transmission chip-to-chip communication pertaining to both the conventional systems described herein and in accordance to the present invention.
Figure 5E:
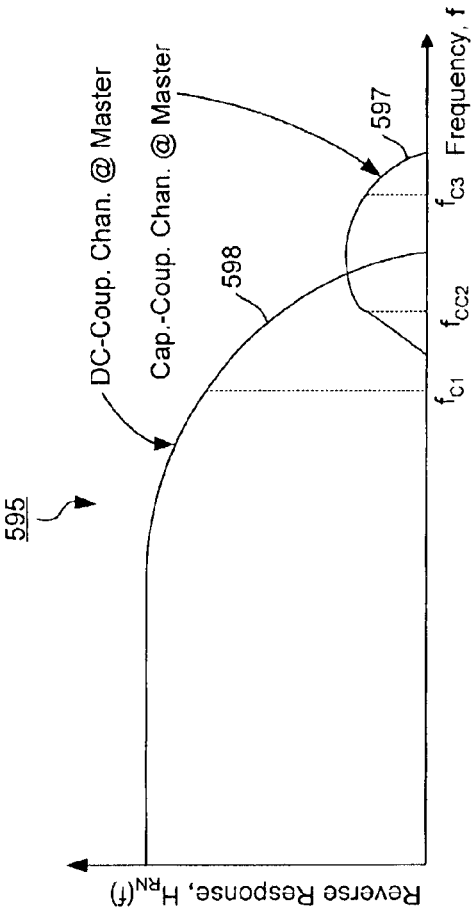
FIG. 5E is a graph representing the frequency response of slave to master transmission in chip-to-chip communication pertaining to both the conventional systems described herein and in accordance to the present invention.
Figure 5B:
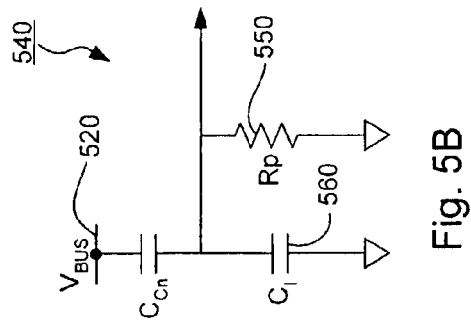
FIG. 5B is a representational schematic diagram illustrating the electrical characteristics of one of the plurality of input/output interface circuits in accordance to the present invention.

With reference to FIG. 5A and FIG. 5B, a representational schematic diagram illustrating the electrical characteristics of one of the plurality of I/O interface circuits 515a to 515n (hereinafter referred to as an I/O interface) for a slave receive mode is shown. Here, circuit model 540 describes some of the dominant electrical characteristics of the slave device I/O interface during signal transfer from master 500 to I/O interface 515n. Circuit model 540 features capacitive coupling element 530, input resistance 550 and input capacitance 560 coupled to input terminal 570. The input resistance may represent the input resistance of the input circuitry, parasitic substrate resistance (not shown), etc., on slave devices 510a to 510n. The input capacitance 560 typically represents an I/O load capacitance stemming from the bond pad to substrate capacitance, output driver parasitics, input transistor capacitances, interconnect capacitances and capacitances due to electrostatic discharge protection devices, etc, just to name a few. In this specific embodiment, the series configuration of capacitive coupling element 530 and input capacitance 560 reduces the total effective capacitance presented to signal line 520 via a capacitive divider characteristic. Thus, the reduction of this total effective capacitance increases the usable range of information transfer frequency along the signal line.

Figure 1:
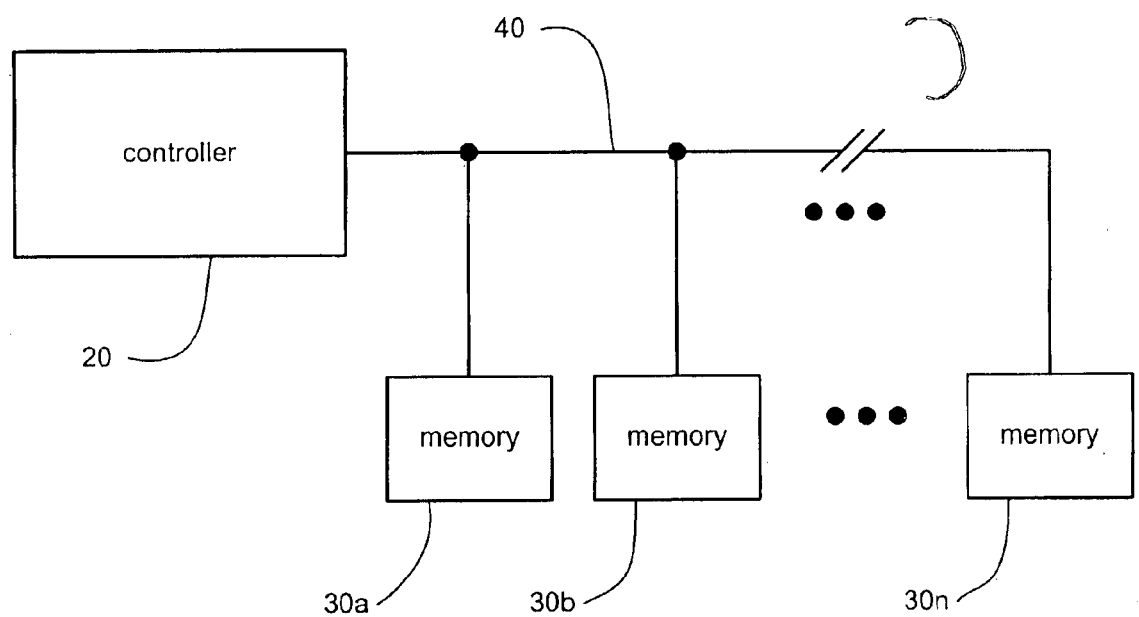
FIG. 1 is a schematic block diagram representation of a conventional chip-to-chip communication system having a master device and a number of directly coupled slave devices.
Figure 2:
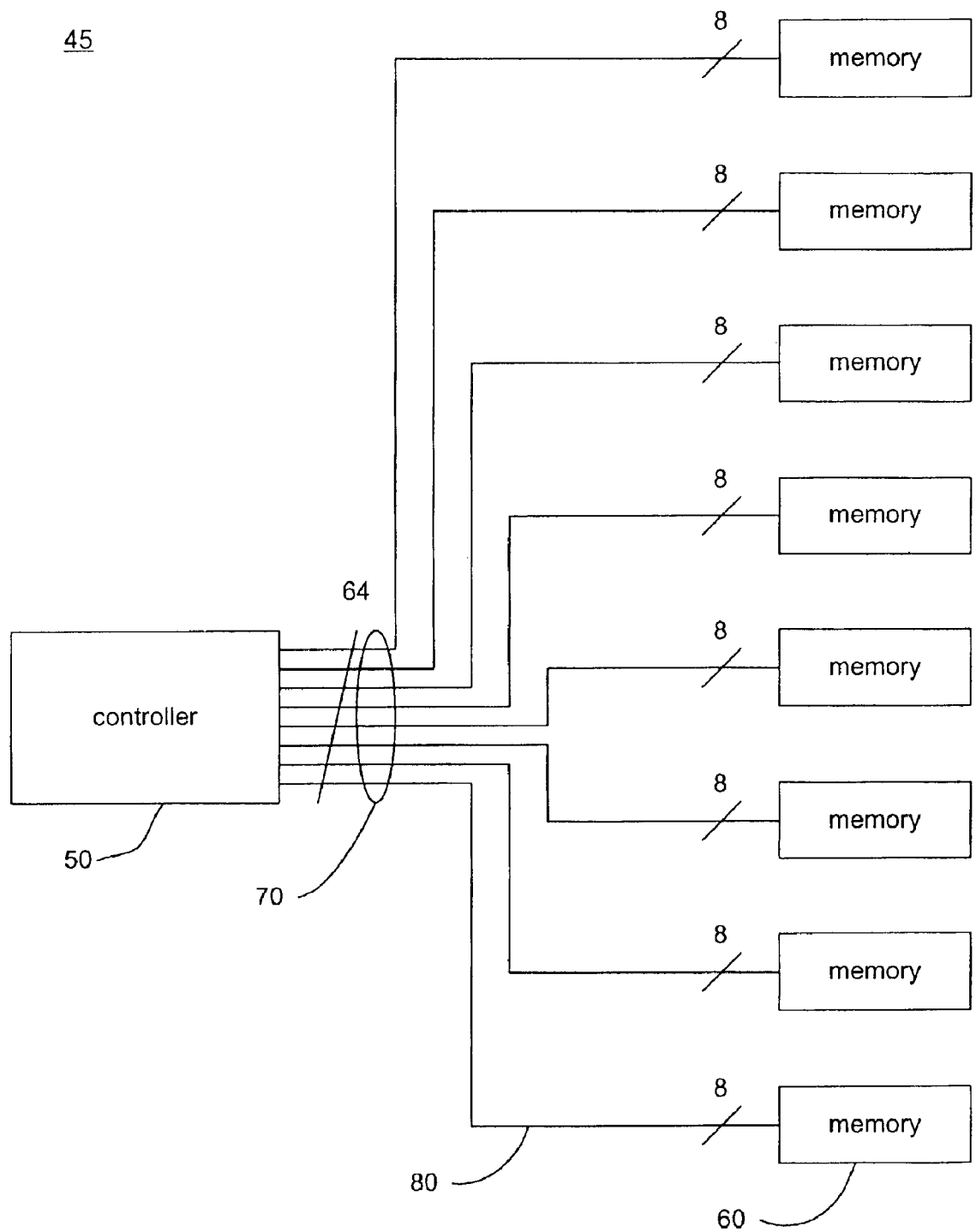
FIG. 2 is a schematic block diagram representation of a chip-to-chip communication system implemented as a conventional memory system having a controller and several memo devices coupled in a parallel configuration.
Figure 3:
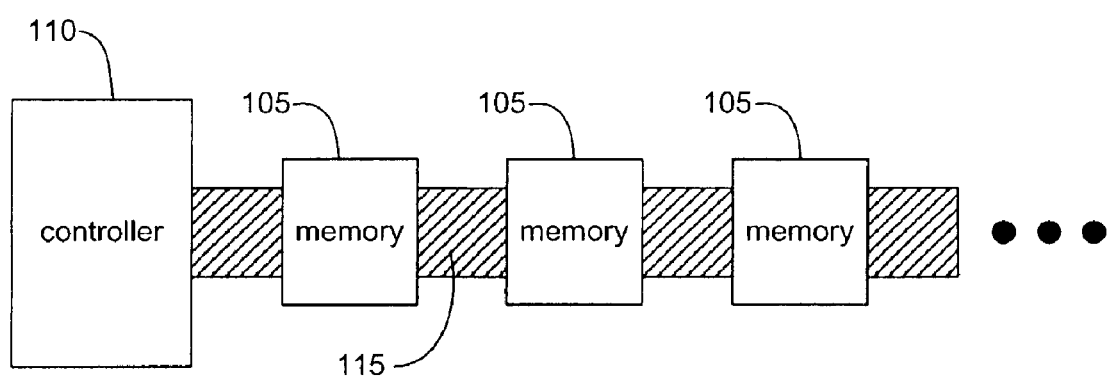
FIG. 3 is a schematic block diagram representation of a chip-to-chip communication system implemented as a conventional memory system having a controller coupled to several memo device on a relatively narrow bus.

With reference to FIG. 5A and FIG. 5C, a logarithmic graph representing the forward transfer function of master to slave transmission in chip-to-chip communication pertaining to both the conventional systems described herein and in accordance to the present invention is shown. Here, three transfer functions 582, 584 and 586, illustrate the bandwidth of the chip-to-chip communication system 505 according to the present invention (FIG. 5A) relative to the bandwidth of the conventional chip-to-chip communication system 10 shown in FIG. 1. In particular, transfer function 582 represents the signal amplitude at the terminator as a function of frequency for signals transmitted by master device 500 to a slave device 510 via signal line 500 for a system implementing the features of the present invention. Transfer function 584 represents signal amplitude as a function of frequency for the signals received at the input terminal 570 via capacitive coupling element 530. In contrast, transfer function 586 represents the signal amplitude as a function of frequency for signals transmitted by controller 20 to a memory device 30 in the conventional (direct coupled) chip-to-chip communication system 10 (FIG. 1).

In short, the chip-to-chip communication system 505 of the present invention achieves a higher maximum effective operation frequency (or cutoff frequency), $f_{c3}$, than the conventional chip-to-chip communication system 10 whose cutoff frequency occurs at $f_{c1}$. That is, the high frequency cut-off $f_{c1}$ of the conventional chip-to-chip communication system 10 is much lower than the high frequency cut-off $f_{c3}$ achievable by a system according to the present invention. Thus, for master to slave transmission path (i.e., the forward channel) higher data transfer rates may be achieved via the techniques and circuitry of the present invention relative to conventional techniques and circuitry.

Figure 5D:
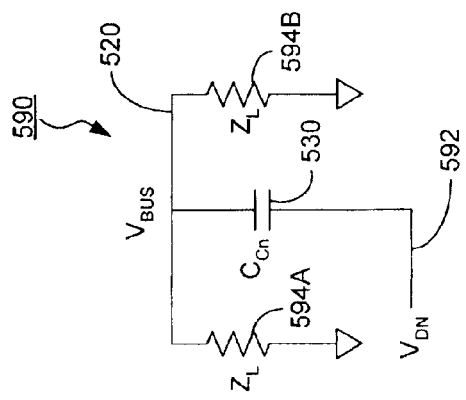
FIG. 5D is a representational schematic diagram illustrating the electrical characteristics of a slave device input/output circuitry for a slave transmit mode in accordance to an embodiment of the present invention.

A schematic representation illustrating the electrical characteristics of a slave device I/O for a slave transmit mode in accordance to an embodiment of the present invention is illustrated in FIG. 5D. Here, circuit model 590 describes several of the dominant electrical characteristics of the slave device I/O interface during signal transfer from slave device 510n to master 500. Circuit model 590 features output terminal 592, capacitive coupling element 530, signal line 520, and effective signal line resistance 594A and 594B.

With reference to FIG. 5E, a graph representing the reverse transfer function of slave to master transmission in chip-to-chip communication pertaining to both the conventional systems described herein and in accordance to the present invention is shown. In particular, transfer function 597 illustrates bandwidth of the slave transmit mode in accordance to the present invention and transfer function 598 illustrates the bandwidth of the conventional chip-to-chip communication system 10 shown in FIG. 1. That is, transfer function 597 represents signal amplitude as a function of frequency for signals transmitted by slave device 510n to a signal line 520 (and ultimately master 500) via capacitive coupling element 530. Transfer function 598 represents the signal amplitude as a function of frequency for signals transmitted by memory device 30n to controller 20 in the conventional directly coupled chip-to-chip communication system 10.

In short, the chip-to-chip communication system 505 (FIG. 5A) achieves a higher maximum operation frequency or cut-off frequency ($f_{c3}$) than maximum operation frequency ($f_{c1}$) of the conventional chip-to-chip communication system 10. Moreover, the slave device to master transmission path (i.e., the reverse channel) exhibits a bandpass characteristic between $f_{cc2}$ and $f_{c3}$. The bandpass characteristic observed for both the forward channel (FIG. 5C) and reverse channel (FIG. 5E) requires the use of source coding or narrow band signaling techniques for communication between master and slave devices. Several of these coding or signaling techniques are described below.

Figure 4A:
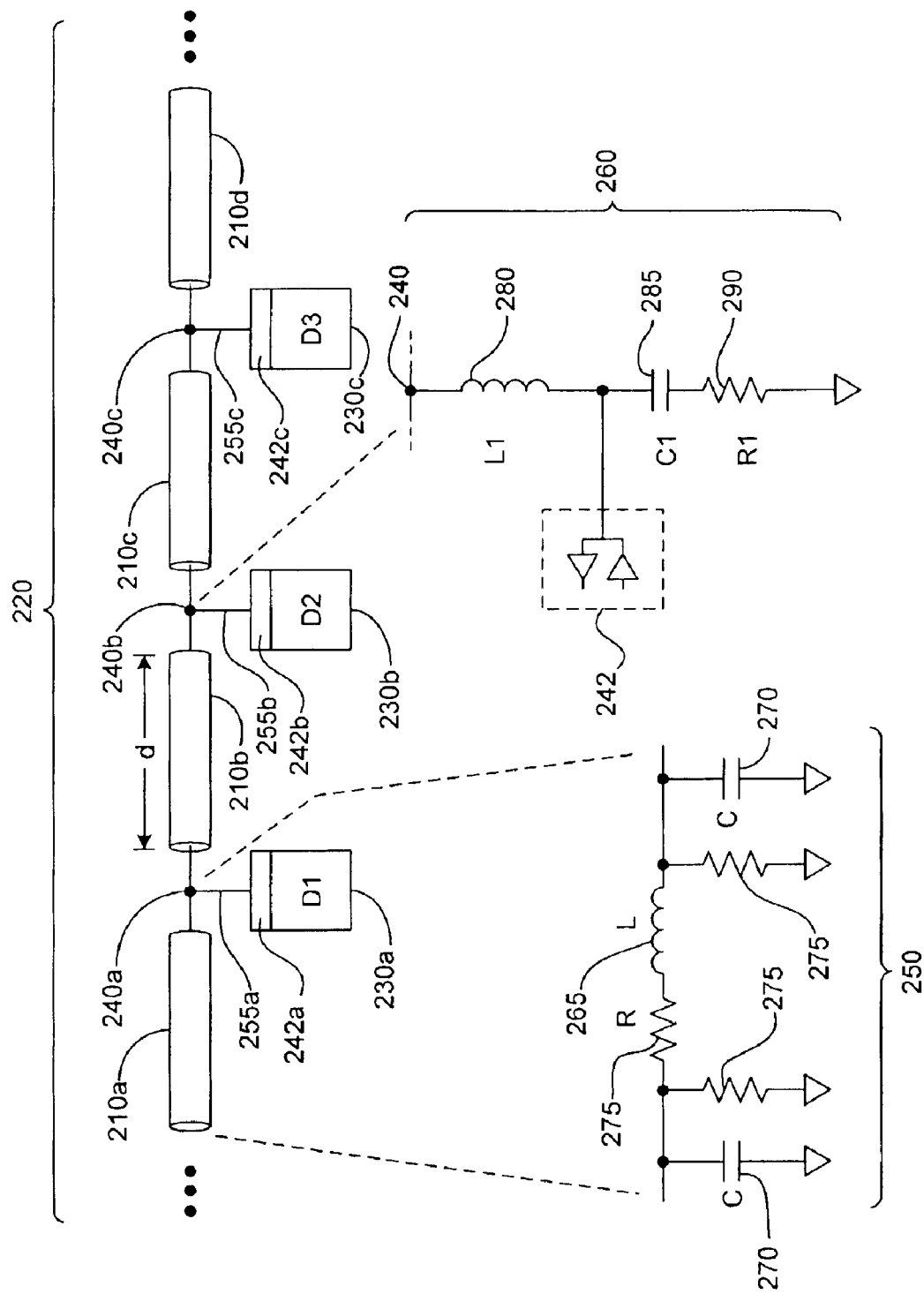
FIG. 4A is a schematic diagram of a chip-to-chip communication system line segment model and an interface conductor model included in a number of devices directly coupled to a signal line.
Figure 4B:
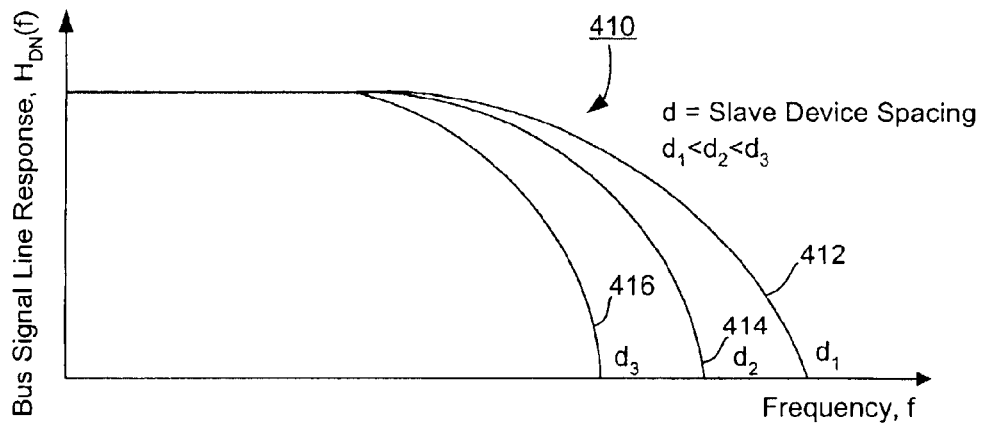
FIG. 4D is a representational graph of the signal line frequency response of the conventional chip-to-chip communication system with respect to three device I/O spacings.
FIG. 4C is a representational graph of the signal frequency response of the conventional chip-to-chip communication system with respect to three device of dissipative loss.
Figure 4C:
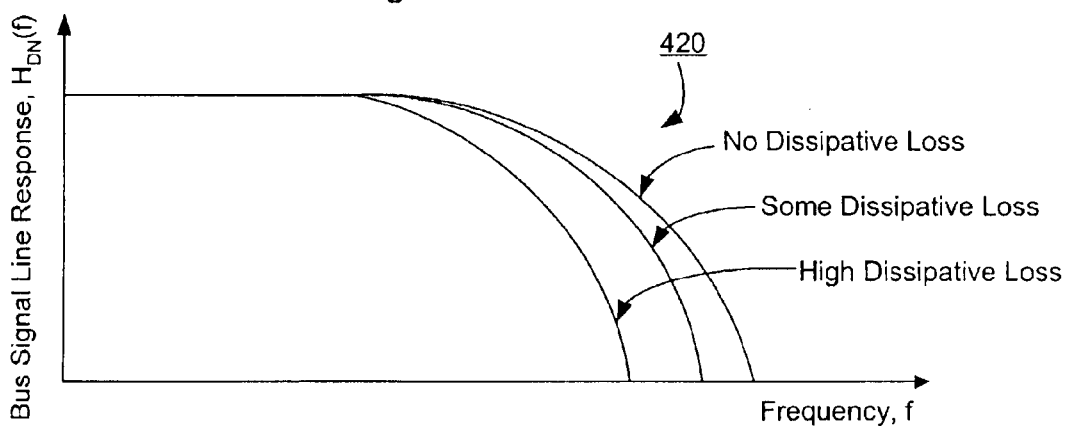
Figure 4D:
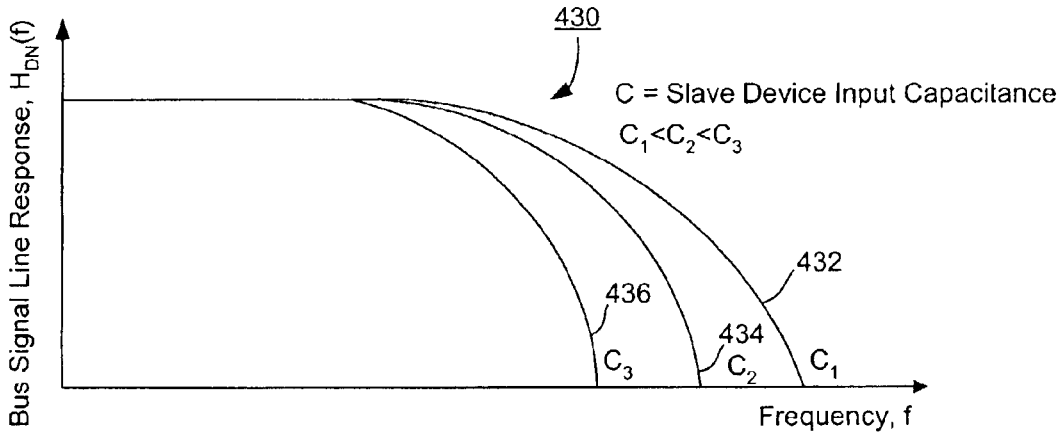

By way of brief recap, the conventional chip-to-chip communication system as shown in FIG. 4A features electrical components of interface conductor model 260. These components are directly coupled to the signal line 220 thereby introducing losses and characteristics which lower the maximum information transfer frequency to the signal line when in operation. By contrast, in FIG. 5A, the capacitive coupling element 530 effectively isolates any losses and characteristics which may be inherent in the interface 515 of the slave device 510, reducing their effect on the signal line. By utilizing the capacitive coupling elements to couple slave devices to the signal line, a much higher information transfer rate is possible in both slave receive mode as characterized by graph 580 (FIG. 5C) and slave transmit mode as characterized by graph 595 (FIG. 5E).

Figure 6A:
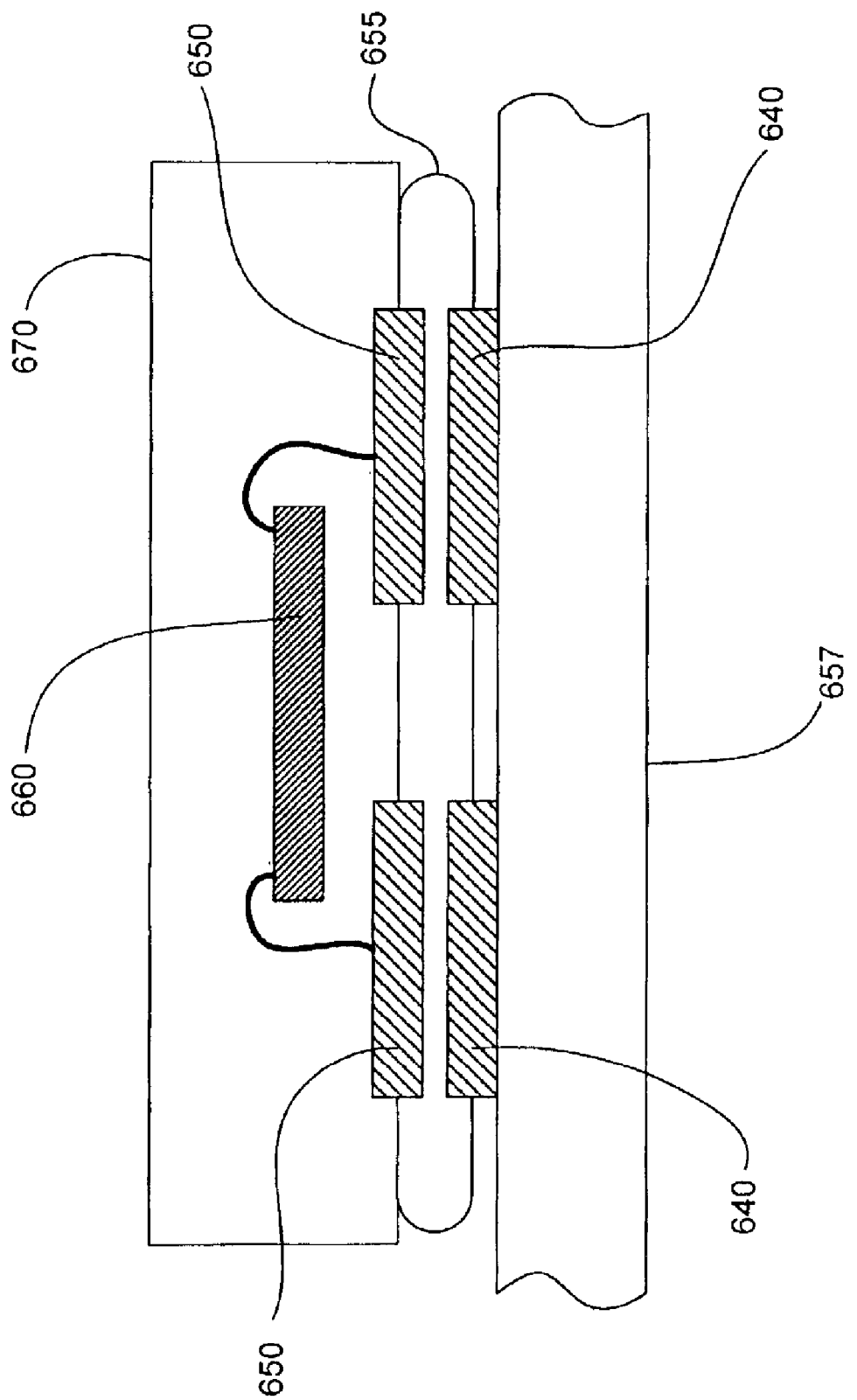
FIG. 6A is a schematic cross sectional representation of an integrated circuit employing a capacitive coupling element according to another embodiment of the present invention.

With reference to FIG. 6A a capacitive coupling element according to another embodiment of the present invention is illustrated. In this embodiment, the capacitive coupling element is disposed external to the slave device. As illustrated in FIG. 5A, this capacitive coupling element is disposed between slave device 510 and the signal line 520. With further reference to FIG. 6A, the capacitive coupling element is situated between a substrate 657 and an integrated circuit device 660. Integrated circuit device 660 is housed in a semiconductor package 670 and is a specific implementation of the slave device 510 as shown in FIG 5A. The capacitive coupling element includes electrodes 640, and electrodes 650 separated by a dielectric material 655. The electrode 640 may be electrically coupled to a signal line 520 typically disposed on substrate 657, such as a printed circuit board (e.g., a memory module or motherboard). The electrodes 640 may be disposed proximal to the signal line and electrically coupled thereto. Alternatively, electrodes 640 may comprise a portion of the signal line itself. Electrodes 650 are connected to interface circuitry (not hewn) of the integrated circuit device 660. The dielectric material 655 may ideally consist of an elastomer material to raise the dielectric constant.

With further reference to FIG. 6A, electrodes 64 may be fabricated fixedly coupled to signal line 520 of FIG. 5A as a snap-in coupling socket. Similarly, electrodes 650 may be disposed on slave device 510 as is described above or in a like manner as a snap-in coupler. The snap-in coupler may be inserted and/or removed from the snap-in coupling socket. Here, the required mechanical snap-in apparatus is employed to dispose electrodes 540 and 550 proximal to each other and hold slave devices in place relative to the signal line. By employing this configuration, the slave device is integrated as a separable snap-in coupling to the signal line. For example, such a slave may be implemented as a plug-in DRAM device. This configuration provides for upgrade-ability and quick replacement since a slave device is easily separable from the rest of the system. Additional slave devices may be easily added into a chip-to-chip communication system provided with empty snap-in coupling sockets.

This configuration may eliminate the need to fixedly attach the slave device to the signal line using solder techniques. To recap, the interface conductor model 260 of FIG. 4A exhibited resistive components 290 resulting from, for example, circuitry and structures such as pins, ball bonds, electrostatic discharge protection devices and solder connections, and semiconductor substrate resistance. By utilizing the capacitive coupling element as the connection structure between slave device and the signal line, fewer losses result and the interface between slave device and signal line is more optimized since resistance components resulting from semiconductor substrate resistance are significantly isolated. In addition, capacitive coupling eliminates the contact resistance inherent in, for example, modular systems.

Figure 7A:
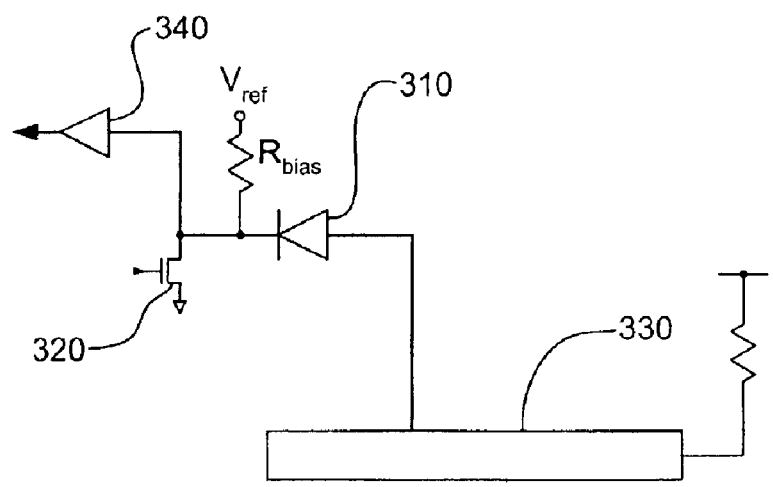
FIGS. 7A–7C are schematic diagram representations of capacitive coupling elements implemented using diode elements according to additional embodiments of the present invention.
Figure 7B:
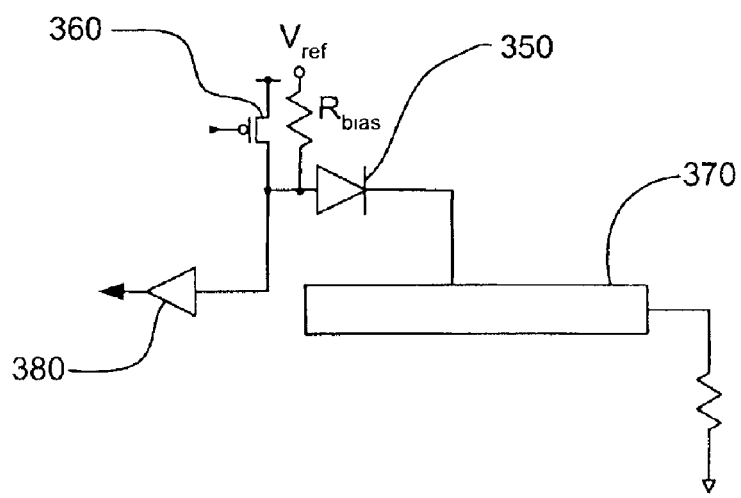
Figure 7C:
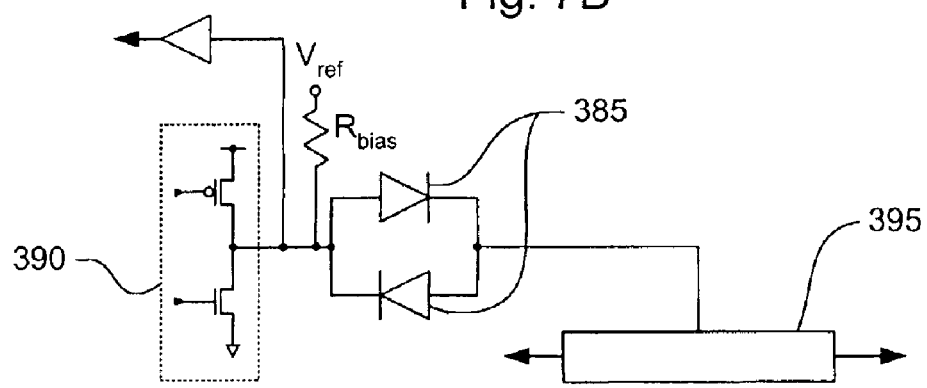

With reference to FIGS. 7A to 7C, in one embodiment the capacitive coupling element 530 of FIG. 5A may be implemented using diode elements. These diode elements may be PN-junction type diodes, Schottky type diodes or otherwise comprise any diode device which provides a capacitive characteristic between at least two terminals. The diode element 310 is employed by a slave device, such as the slave device 510 of FIG. 5A, to transfer information between the slave device and a signal line 330. Here, output driver 320 and input receiver 340 are coupled via diode element 310 to a signal line 330.

In a slave receive mode, for example, the slave receives information in a write operation, input receiver 340 accepts information from signal line 330 via diode element 310. The diode element 310, in this mode, is placed in a reverse biased condition so that a capacitive property is established between input receiver 340 and signal line 330. Here, the diode element exhibits high impedance properties and provides a high impedance connection between the signal line 330 and the input receiver 340.

In a slave transmit mode, output driver 320 may be directly coupled to signal line 330 to provide information in, for example, a read operation. The output driver 320 is configured in a pull-down configuration. In this particular mode, the output driver 320 provides information directly to signal line 330 by sinking current from signal line 330. In this regard, diode element 310 is forward biased and exhibits a forward conducting characteristic. Here, the diode element exhibits low impedance properties and provides a low impedance connection between the output driver 320 and the signal line 330.

Thus, in the slave receive mode, the input receiver 340 is capacitively coupled to the signal line 330 via a reverse biased diode element 310. In the slave transmit mode, however, information is directly coupled between the output driver 320 and signal line 330 thus, maximum energy may be transferred between the slave and the signal line. By providing a direct couple option in a slave transmit mode, enhanced coupling to the bus is achieved during the read operation while losses presented to the signal line are minimized.

Where the capacitive coupling element is embodied as the diode element 310, as illustrated in FIG. 7A, and a plurality of slave devices populate the signal line 520, as illustrated in FIG. 5A, one of the slave devices 510 may be in a slave transmit mode during a read operation (i.e., in an "active" mode) and the other slave devices may be in an inactive mode. Under these circumstances, the diode element in the slave device which is in the active mode is placed in the direct couple state (i.e., a forward biased condition) with the signal line. The diode elements in the slave devices which are in the inactive are placed in a capacitive coupling condition (i.e., a reverse biased condition) with the signal line. As such, only one device is driving or sinking current on the line. When all slave devices are inactive—that is, neither transmitting nor receiving information—the slave devices remain effectively capacitively coupled to the signal line and each respective diode element is placed in a reverse biased condition.

By directly coupling to the signal line, a slave device in a slave transmit mode has the advantage of providing strong drive signal while introducing only small additional loss components (such as those from the interface conductor model presented in FIG. 4A) to the signal line. Since only one set of these loss components (i.e., loss components from one slave device) contribute losses to the signal line, a much greater maximum rate of information transfer is facilitated between slave device and signal line as compared to the conventional chip-to-chip communication system shown in FIG. 1.

Additional coupling configurations employing diode elements as the capacitive coupling element 530 are possible and may be substituted for the configuration presented in FIG. 7A. In this regard, with reference to FIG. 7B, a diode element 350 is employed to electrically couple output driver 360 to a signal line 370 in a pull-up configuration. Here, the operation is essentially the same as is taught for FIG. 7A with the exception that, in this embodiment, a slave transmit mode is supported by driving current onto the signal line. In a slave receive mode, or otherwise when slave devices are inactive, diode element 350 provides a capacitive coupling characteristic to signal line 370.

Similarly, with reference to FIG. 7C, diode elements 385 are employed in an operation essentially the same as is taught for FIGS. 7A and 7B, with the exception that output drivers 390 are disposed in a push-pull configuration. In this embodiment, a slave transmit mode is realized by driving or sinking current onto signal line 395. In a slave receive mode, or otherwise when slave devices are inactive, diode elements 385 are placed in a reverse biased condition and provide a capacitive coupling characteristic to signal line 395.

Other circuit elements which provide a dynamic capacitive option and direct coupled option may be substituted for the diode elements. For example, a simple circuit arrangement which switches a capacitive coupling element into the I/O path of the slave device when the slave device is receiving and direct couples the slave device output to the signal line when the slave device is transmitting may be utilized.

In sum, the capacitive coupling element 530 of FIG. 5A may be implemented with a diode element. The diode element may provide the additional advantage of capacitively coupling the signal line to the slave in, for example, a slave receive mode and direct coupling the slave device to the signal line in a slave transmit mode. Having a direct coupling option in this context, provides increased flexibility and enhanced coupling to the signal line is achieved in slave transmit mode since maximum energy may be transferred between the slave and the signal line.

Figure 8A:
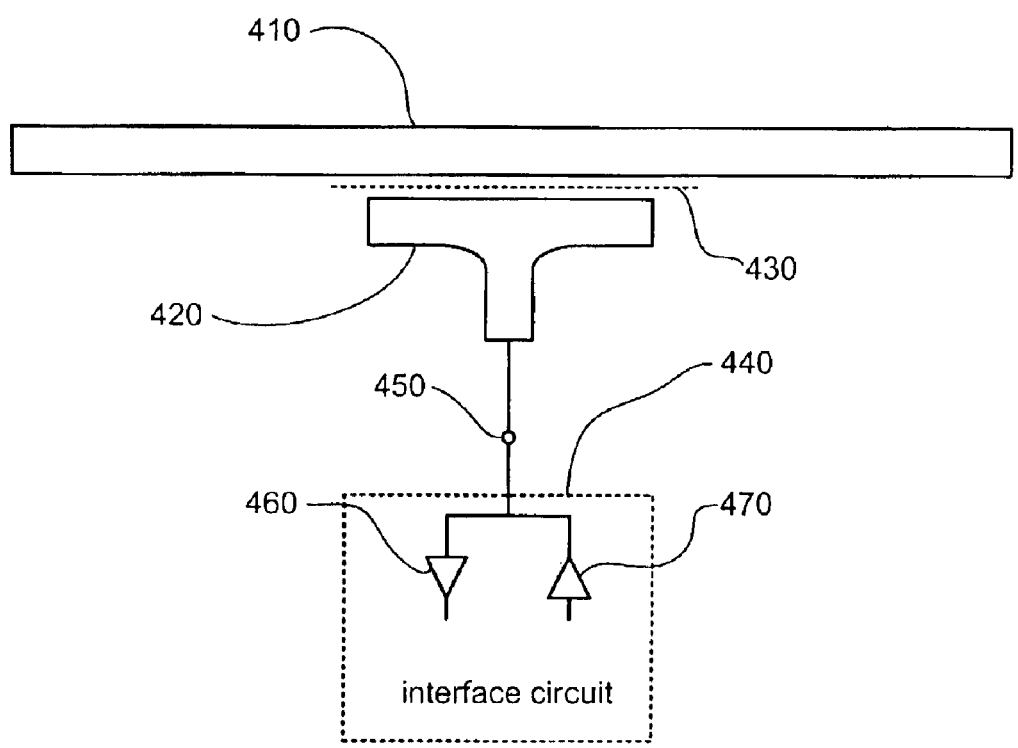
FIGS. 8A and 8B are a schematic block diagram representation of a capacitive coupling element implemented as a microwave coupler according another embodiment of the present invention.
Figure 8B:
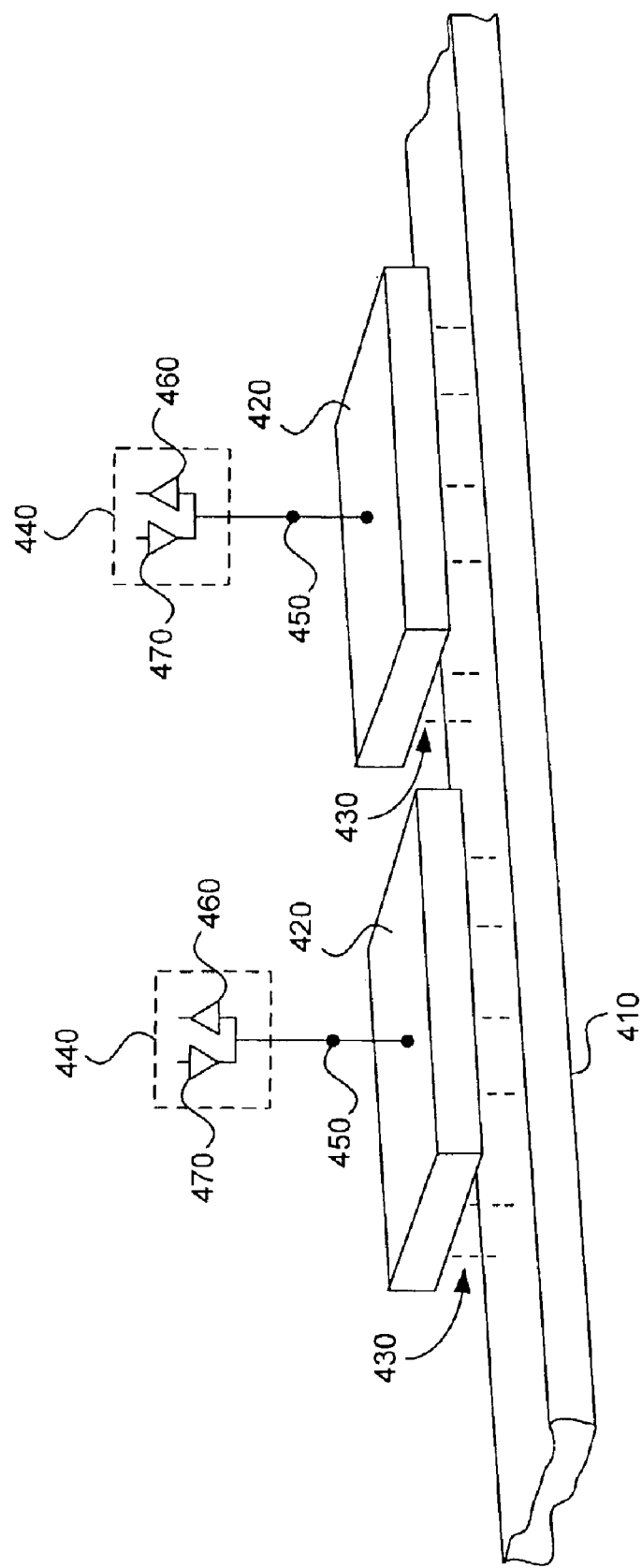
Figure 8C:
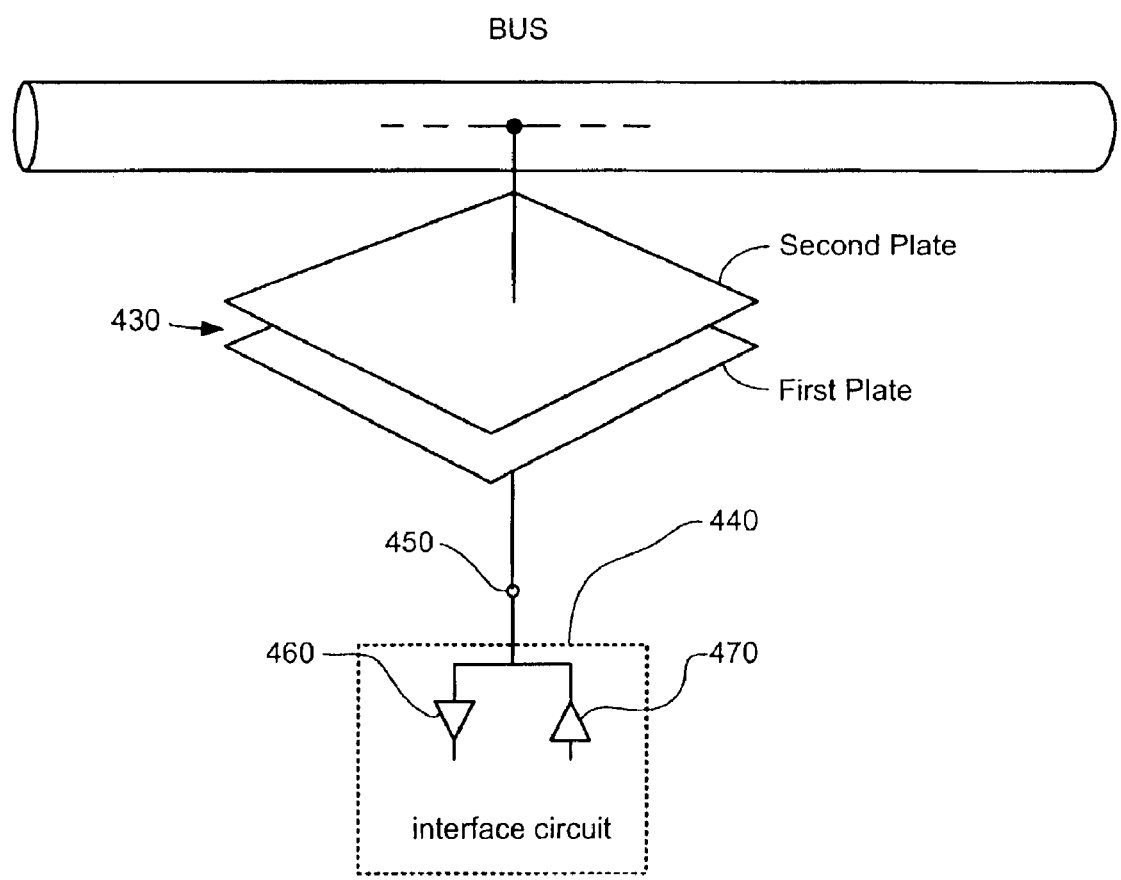
FIG. 8C is a representation of a capacitive coupling element implemented as a microwave coupler according to FIGS. 8A and 8B.

With reference to FIGS. 8A and 8B, the capacitive coupling element 530 of FIG. 5A is shown in an alternative embodiment. Here, the capacitive coupling element is implemented from a microwave coupler. The microwave coupler is disposed between interface circuitry 440 and signal line 410. In this embodiment, a micro-strip electrode 420 is placed in close proximity to signal line 410. Micro-strip electrode 420 is a first capacitor electrode and is electrically coupled to interface circuitry 440. The portion of signal line 410 in close proximity to micro-strip electrode 420 forms a second capacitor electrode. The first and second capacitor electrodes may be implemented as well known capacitor electrode structures, for example, as square or rectangular plates as illustrated equivalently in FIGS. 8B and 8C. Dielectric medium 430 (e.g., air or an elastomer) separates the first and second capacitor electrodes of the microwave coupler. The micro-strip electrode 420 is electrically coupled to a terminal 450. Interface circuitry 440 includes input receiver 460 coupled to terminal 450 to receive information from the signal line 410.

An output buffer 470 is coupled to terminal 450 to transmit information onto the signal line 410. In this embodiment, both input receiver 460 and output buffer 470 are both commonly coupled to terminal 450. This configuration provides efficient usage of physical layout space. Depending on the application, the interface circuitry may include either or both of the input receiver and the output buffer.

Figure 9:
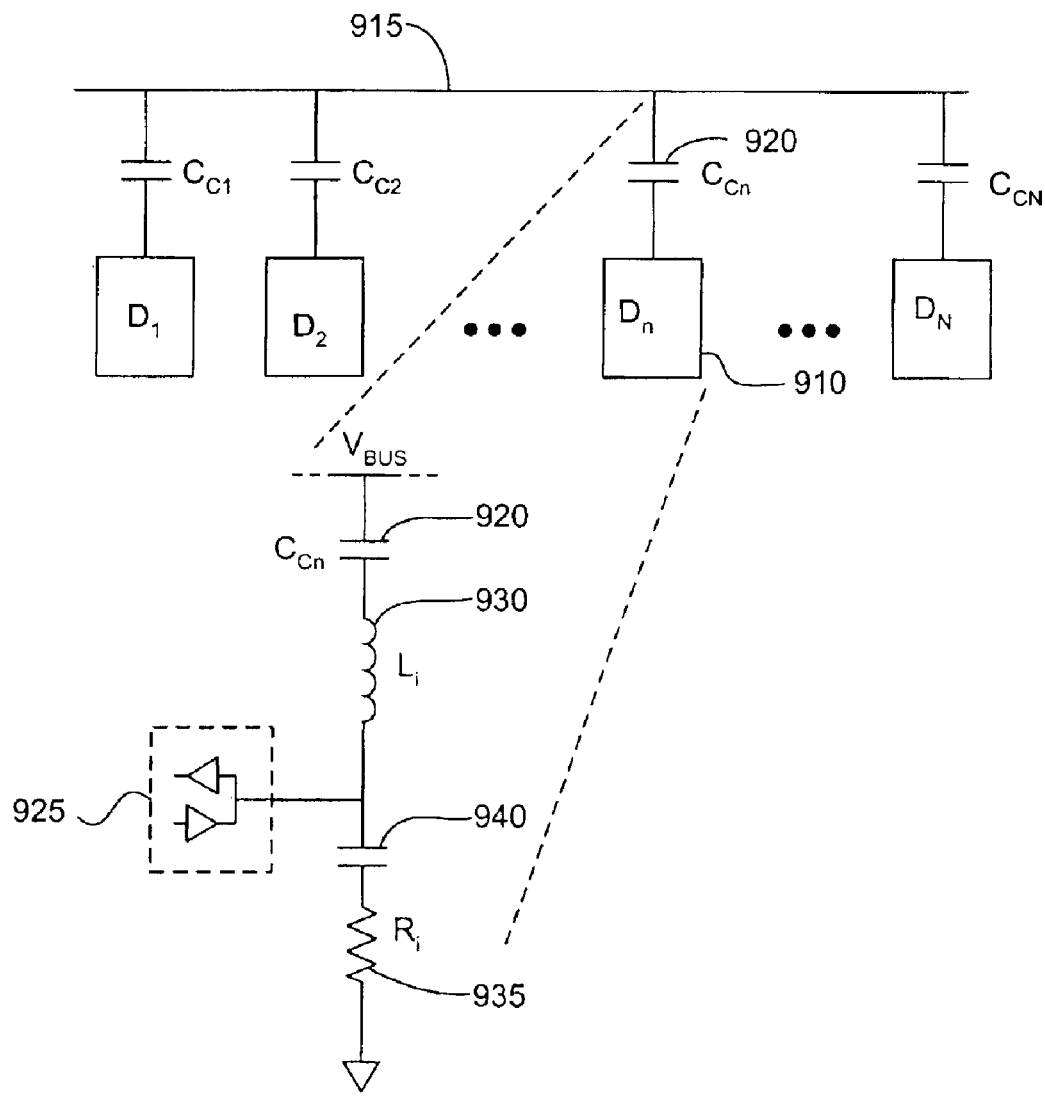
FIG. 9 is a schematic diagram of an interface model of a chip-to-chip communication system in accordance with the present invention.

With reference to FIG. 9, an interface model of a chip-to-chip communication system in accordance with the present invention will now be explained. Device 910 is coupled via a capacitive coupling element 920 to a signal line 915. Interface circuitry 925 and capacitive coupling element 920 are coupled to inductive component 930, resistive component 935 and capacitive component 940. These components model or describe the electrical behavior of the circuitry and structure coupling a device to the signal line. Such circuitry and structure may include bond wires, pins, modules connectors, circuit card connectors, ball bonds, bond pads, ESD structures, integrated circuit substrate and related interconnects.

With continued reference to FIG. 9, the inductive, capacitive and resistive components in the interface model are isolated from the signal line 915 by capacitive coupling element 920. The series configuration of capacitive coupling element 920 and capacitive component 940 reduces the total effective capacitance presented to the signal line 915. Thus, the reduction of this total effective capacitance increases the usable range of information transfer frequency between the signal line and the interface circuitry. In addition, the effect of the capacitive coupling element 920 reduces the total losses resulting from the inductive component 930, resistive component 935 and capacitive component 940. Thus, the capacitive coupling element 920 plays a significant role in increasing the maximum useful information transfer rate.

In the chip-to-chip communication system according to an embodiment of the present invention, the transfer of information via one or more capacitive coupling elements requires signaling which supports a capacitive coupling transfer characteristic. Here, signaling employed in the conventional direct coupled approach may be deemed inappropriate since these systems exhibit a lowpass transfer characteristic. That is, the information is transferred in a range of frequencies ranging from zero (i.e., direct current or DC) to some high frequency. Here the term "frequency" describes a rate of change in the property of a signal, such as voltage amplitude, with respect to time. A capacitive coupling operation may be optimized using a bandpass transfer characteristic. That is, a system with capacitive coupling elements may be suited when information is transferred in a range of frequencies exclusive of zero frequency. By way of note, in a binary coding signaling system, a long series of consecutive binary zero or binary one symbols is effecting a zero frequency transfer rate having a DC characteristic.

Some signaling techniques in accordance to embodiments of the present invention are, for example, source coding, phase modulation, transition detection, and delay modulation. Each technique offers various advantages, as discussed in detail below.

In the source coding technique, patterns of consecutive binary bit symbols are substituted with codes which contain selected non repetitive bit patterns. By avoiding the likelihood of consecutive binary bit patterns, a specific bandpass characteristic may be realized independent of the nature of the bits being broadcast.

With reference to Table 1, a source coding scheme in accordance to an embodiment of the present invention is shown. Here, an additional bit is incorporated into the encoding system such that any possible pattern of more than 4 consecutive like symbols are broken. This exemplary encoding scheme avoids patterns of more than four consecutive binary ones or more than four consecutive binary zeros by encoding with a five bit code. For example, symbol sequence 00100 may be defined to represent symbol sequence 0000 and symbol sequence 11011 may be defined to represent 1111. All other combinations are chosen in like fashion to avoid any possible occurrence of more than four consecutive ones or more than four consecutive zeros.
Table 1.

TABLE 1

| Binary Value | Source Code |
| --- | --- |
| 0000 | 00100 |
| 0001 | 00101 |
| 0010 | 00110 |
| 0011 | 01001 |
| 0100 | 01010 |
| 0101 | 01011 |
| 0110 | 01100 |
| 0111 | 01101 |
| 1000 | 10010 |
| 1001 | 10011 |
| 1010 | 10100 |
| 1011 | 10101 |
| 1100 | 10110 |
| 1101 | 11001 |
| 1110 | 11010 |
| 1111 | 11011 |

Figure 10:
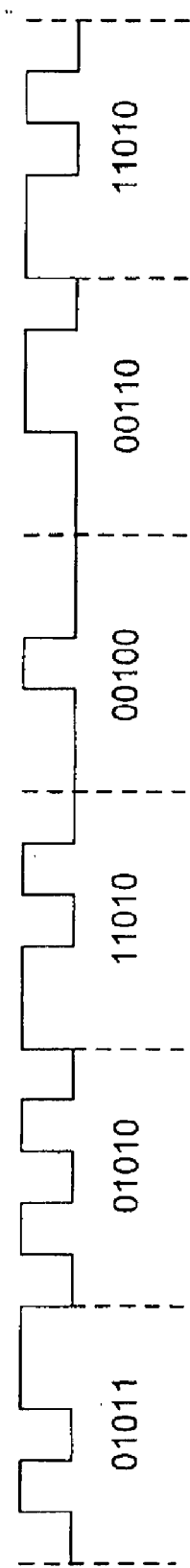
FIG. 10 is a random pattern of source encoded binary information in accordance to an exemplary signaling technique of the present invention.

With reference to FIG. 10 a random pattern of source encoded binary information according to the present invention is shown. Here information stream 1000 is one example of signaling suited for a chip-to-chip communication system employing a capacitive coupling element. In this example, the binary pattern of representational ones and zeros encoded from a random sequence of binary values illustrates that the occurrence of like symbols does not exceed a consecutive like symbol limit of four consecutive ones or zeros. Other consecutive like symbol limits may be chosen, for example, three, five or six, symbol limits may be utilized.

In the phase modulation technique, information is represented by a phase shift of a particular frequency. Since the frequency is relatively constant, a bandpass characteristic and thus higher frequencies information transfer may be realized. Some phase modulation techniques which may be viable for communicating via capacitive coupling elements include binary phase shift keying (BPSK), and quadrature phase shift keying (QPSK).

Figure 11:
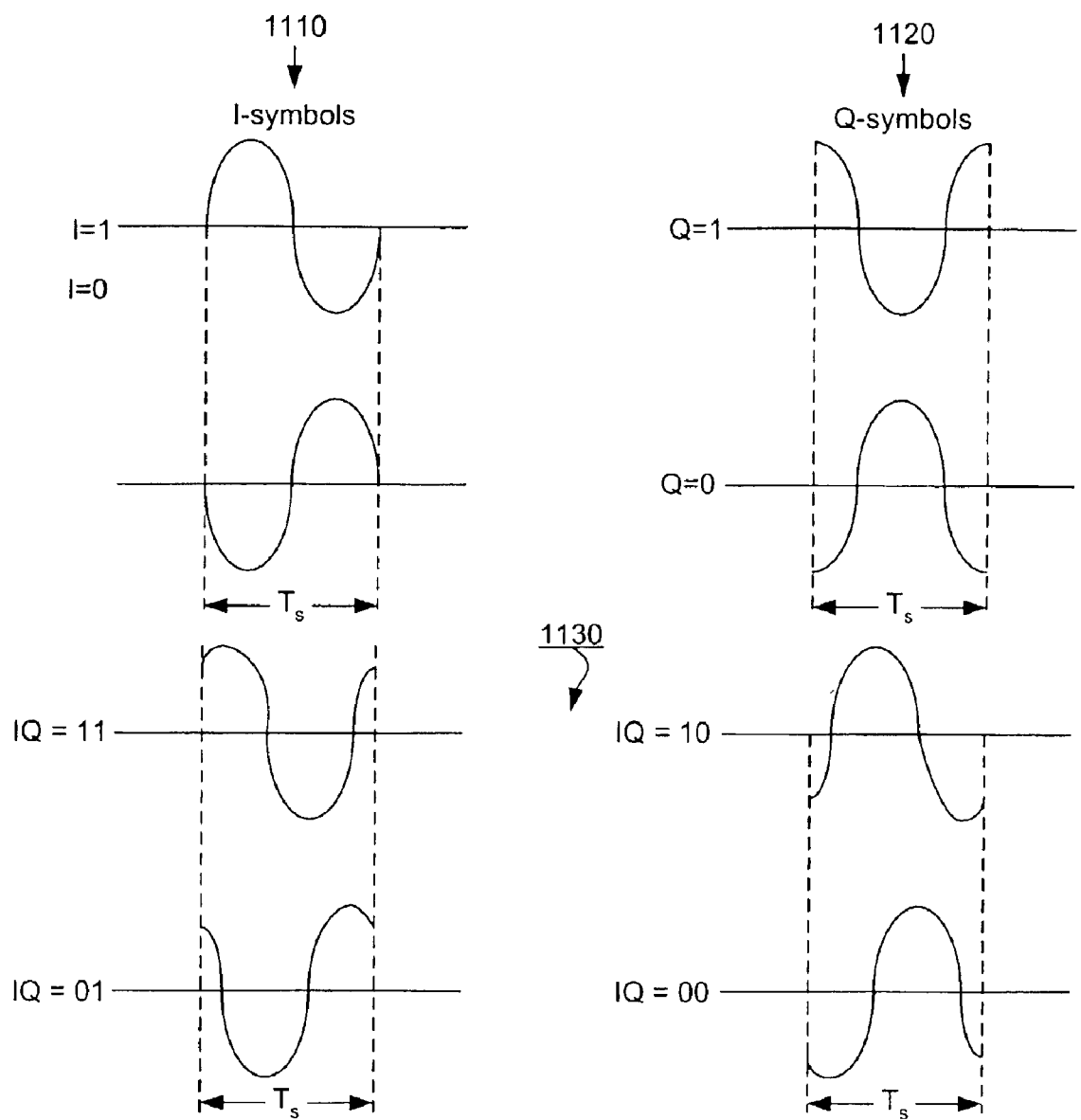
FIG. 11 and FIG. 12 illustrate symbols employed in quadrature phase shift keying in accordance to an embodiment of the present invention.
Figure 12:
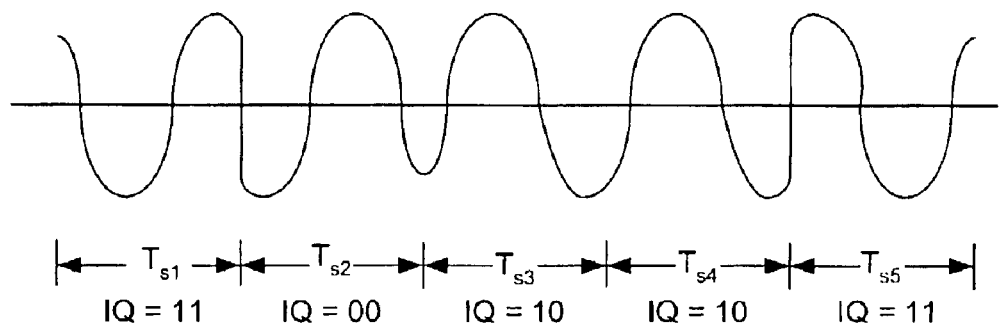

With reference to FIG. 11 and FIG. 12, the QPSK symbols employed illustrates quadrature phase shift keying in accordance to an embodiment of the present invention. Basis I symbols 1110 are combined with basis Q symbols 1120 to form composite symbols 1130. Composite symbols 1130 result from different phase combinations of combining I basis symbols 1110 and Q basis symbols 1120. In this specific embodiment, two bits of information are transferred during each symbol period FIG. 12 illustrates one possible information bit stream of QPSK symbols.

Figure 13:
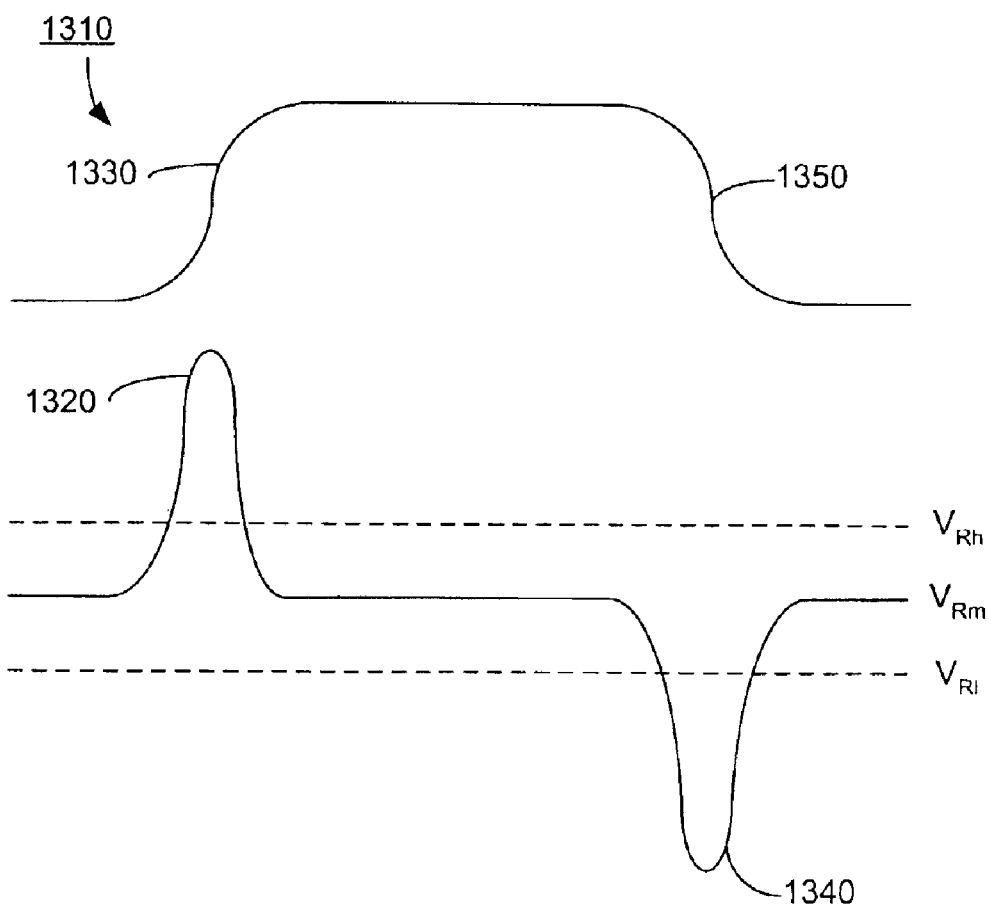
FIG. 13 is an illustration of representative signaling waveforms utilized in the transmission of binary information in on embodiment according to the present invention employing transition detection.

With reference to FIG. 13, signaling waveforms utilized in the transmission of binary information in an embodiment according to the present invention employing transition detection is illustrated. Here, binary information (i.e. data) 1310 is encoded via both a positive spike 1320 correlating with a positive transition 1330 and a negative spike 1340 signifying a negative transition 1350. These schemes may be the inverse, for example, a positive transition may be encoded as a negative spike and a negative transition may be encoded as a positive spike.

Thus, in this embodiment, a positive pulse having relatively short duration signifies the beginning of a sequence of at least one consecutive binary one symbol. Likewise, a negative pulse having a relatively short duration signifies the beginning of a sequence of at least one consecutive binary zero symbol.

Transition detection may be suited for transmitting or coupling information via the capacitive coupling element, for example, the information may be coupled from an integrated circuit via a capacitor to a signal line of a bus.

Figure 14:
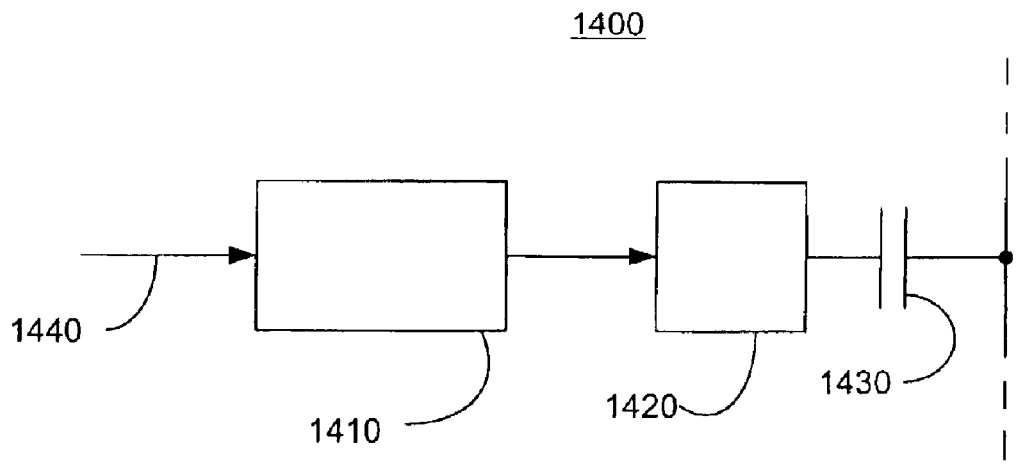
FIG. 14 is a representational block diagram of a transmitter for transition detection encoding and transmission in accordance to an embodiment of the present invention

With reference to FIG. 14, a representational block diagram of a transmitter for transition detection encoding and transmission in accordance to an embodiment of the present invention is illustrated. Encoder/transmitter 1400 comprises a high pass filter 1410 and a driver 1420 coupled to capacitive coupling element 1430. Information in conventional format, for example, binary format is received via input 1440. In this specific embodiment, high pass filter 1410 encodes the information into positive and negative pulses as illustrated in FIG. 13. The positive and negative pulses are driven via driver 1420 to capacitive coupling element 1430.

Figure 15:
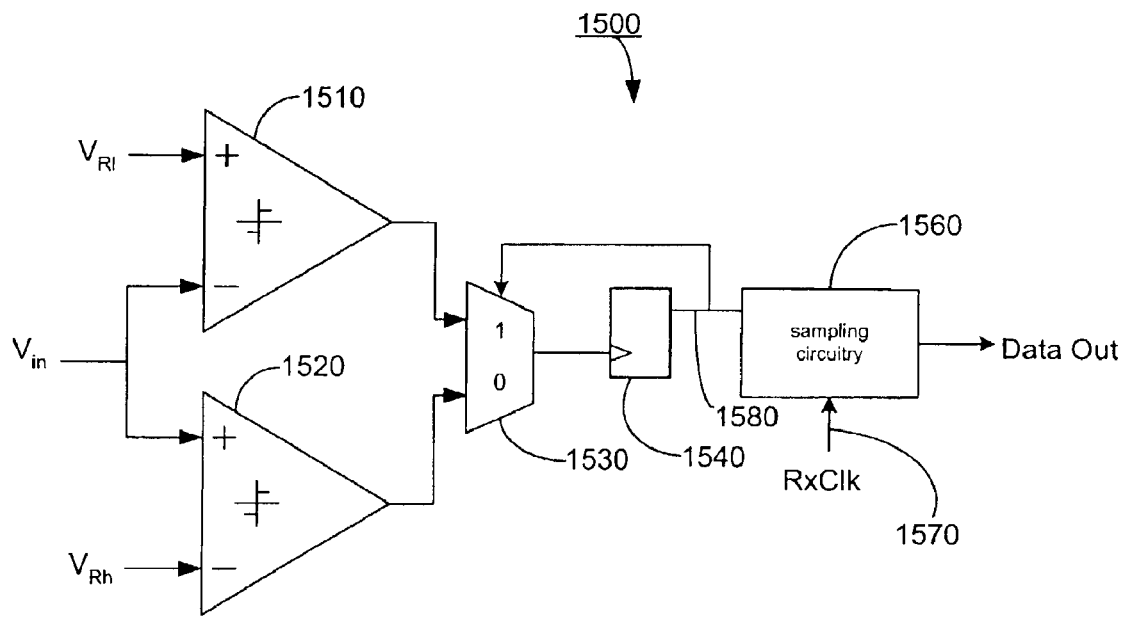
FIG. 15 is a schematic diagram of receiver circuitry for transition detection decoding according to an embodiment of the present invention.

With reference to FIG. 15, a schematic diagram of receiver circuitry for transition detection decoding according to an embodiment of the present invention is illustrated. Receiver circuitry 1500 includes comparators 1510 and 1520, coupled to multiplexor 1530 and flip-flop 1540. Flip-flop 1540 is fed to multiplexor 1530 and sampling circuitry 1560. Multiplexer 1530 is coupled to comparators 1510 and 1520, and flip-flop 1540. Sampling circuitry 1560 receives a clock 1570 to sample the output data at correct clocking intervals.

In this embodiment, comparators 1510 and 1520 receive input information Vin encoded in transition detection format. Input information Vin in this format is suited for coupling via a capacitive coupling element (not shown). Comparators 1510 and 1520 each compare the information Vin against reference voltages VRI and VRH representing threshold levels which may be arbitrarily set to define signal margins. These signal margins establish the signal amplitudes which constitute the positive and negative pulses. Multiplexer 1530 responds to flip-flop 1540 output 1580. Flip flop 1540 toggles between a logic high and logic low state in response to multiplexer output 1590 and, in a feedback loop, multiplexer output 1590 is determined by the state of flip flop output 1580 by selecting one of two outputs from comparators 1510 and 1520

In operation, transition detection encoded input information Vin comprises positive pulses to trigger at least one consecutive binary one state and negative pulse triggers at least one consecutive binary zero state. Multiplexor 1530 and the feedback of flip-flop 1540 output 1580 detects if a transition from consecutive one to consecutive zero occurs (i.e. a negative pulse) and toggles flip-flop 1540 accordingly. Similarly flip-flop 1540 toggles when a transition from consecutive zero to consecutive one detected. Sampling circuitry then re-aligns the recovered data synchronously with respect to clock 1570.

Figure 16:
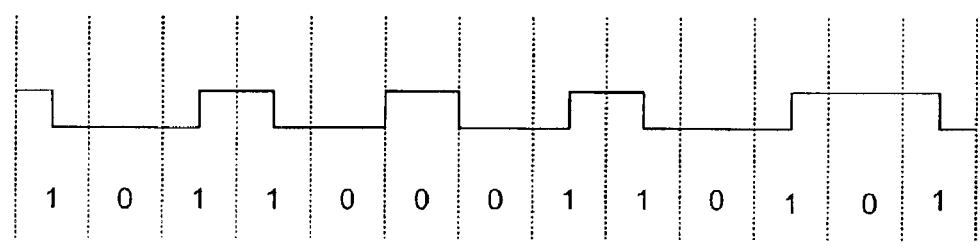
FIG. 16 is a diagram representing a sample binary bit stream pertaining to delay modulation signaling in accordance to an embodiment of the present inventions.

With reference to FIG. 16, a diagram representing a sample binary bit stream pertaining to delay modulation signaling in accordance to an embodiment of the present invention is illustrated. In the delay modulation technique, a one may be represented by a transition at the midpoint of an information bit period. A zero may be represented by no transition, unless it is followed by another zero. In this case, a transition is placed at the end of the information bit period of the first zero.

Figure 17:
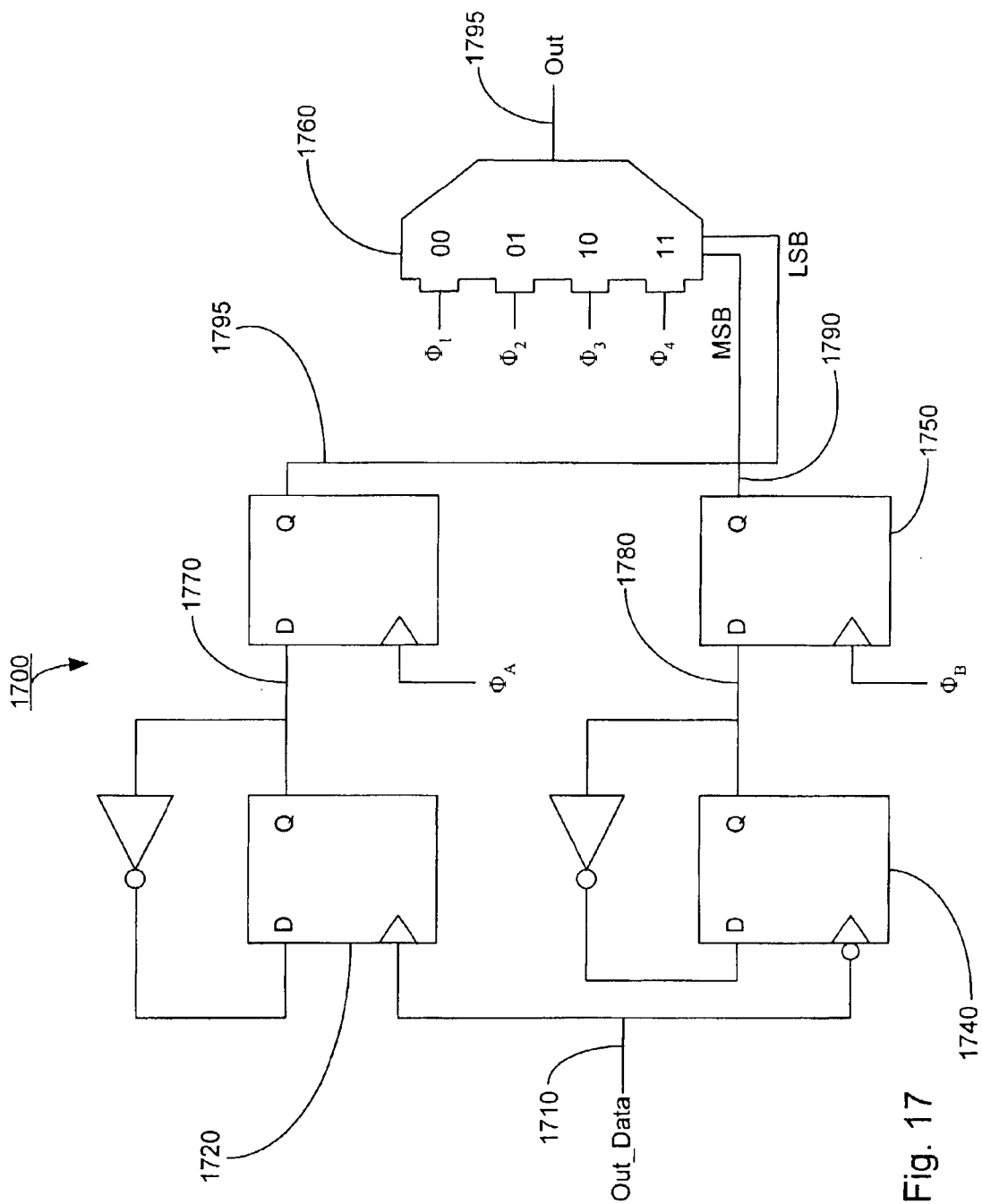
FIG. 17 is a schematic diagram of a delay modulation encoding circuit in accordance to one embodiment of the present invention.
Figure 18:
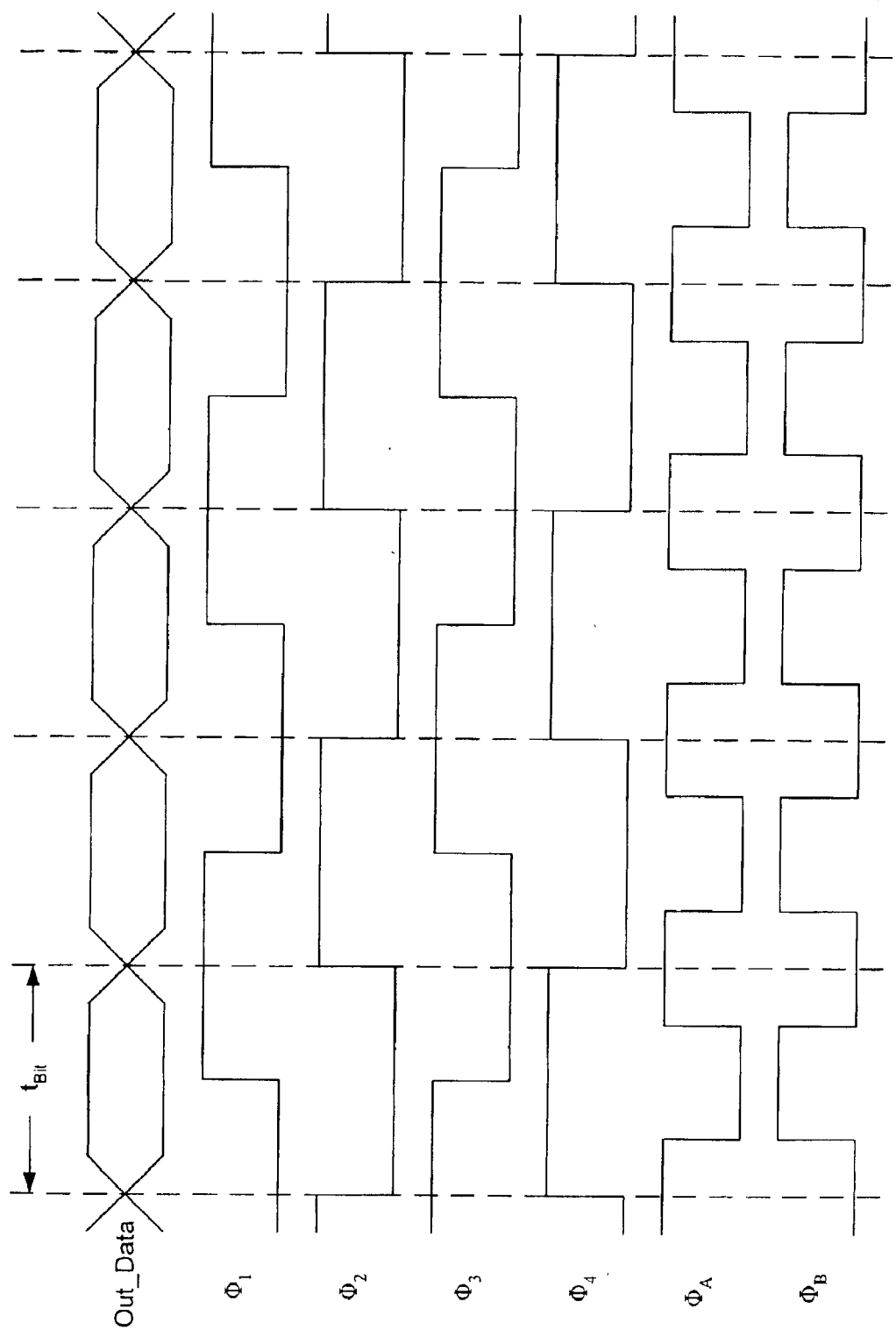
FIG. 18 is an operation waveform of a delay modulation encoding circuit of FIG. 17.

With reference to FIG. 17 and FIG. 18, a schematic diagram and operation waveforms of a delay modulation encoding circuit in accordance to a specific embodiment of the present invention is illustrated. In this specific embodiment, delay modulation circuit 1700 includes flip flops 1720 to 1750, and multiplexer 1760. Flip flops 1730 and 1750 receive clocks $\Phi_A$ and $\Phi_B$ respectively, while multiplexer 1760 receives clocks $\Phi_1$ to $\Phi_4$. Delay modulation circuit 1700 receives binary information at input 1710. The binary information is encoded into delay modulated form and output at terminal 1795 of delay modulation circuit 1700 by multiplexing a corresponding clock selected from clocks $\Phi_1$ to $\Phi_4$.

In this specific embodiment, flip-flop 1720 is triggered to toggle output 1770 by the binary information at input 1710. Similarly flip flop 1740 is triggered to toggle flip-flop output 1780 by the inverse of the binary data at input 1710. Clock $\Phi_B$ strobes flip-flop output 1780 into flip flop 1750 during a first interval and outputs the selection bit 1795. Clock $\Phi_A$ strobes flip-flop output 1770 into flip flop 1750 during a consecutive interval to output selection bit 1790. Selection bits 1795 and 1790 select one of four clocks $\Phi_1$ to $\Phi_4$ to modulate the binary data at input 1710 into delay modulated form. The binary data at input 1710 is translated into delay modulated form via the operation of selecting one of four clocks $\Phi_1$ to $\Phi_4$ mapped accordingly onto output 1795.

In summary, the present invention is a chip-to-chip communication system having circuitry and an interface technique which support higher rates of information transmission and reception by using a capacitive coupling element. In one embodiment, the system of the present invention utilizes capacitive coupling elements between slave devices and a signal line to achieve an enhanced information transfer rate when appropriate signaling techniques are used.

In the present invention, the capacitive coupling element may be employed in connecting structures between a slave device and a signal line. By utilizing this technique, the present invention provides immunity toward losses associated with the connection structure of the conventional directly coupled approach. In another alternate embodiment, the capacitive coupling element may comprise any diode element(s) which provides a capacitive characteristic between two terminals. In this embodiment, the diode element has the additional advantage of capacitively coupling the bus to the slave interface in a slave receive mode and direct coupling the slave interface to the bus in a slave transmit mode. This type of configuration still retains a high speed information transfer rate since the loss characteristics of the bus are tightly minimized. Also, greater coupling to the signal line in a slave transmit mode is achieved.

While this invention has been described in connection with what is presently considered to be the most practical and preferred embodiments, it is to be understood that the invention is not limited to the disclosed embodiments. In this regard, one of ordinary skill in the art will readily recognize that the slave device may take form of and be embodied as different types of integrated circuit devices circuit cards or modules, such as memory modules. In addition, the capacitive coupling elements themselves may take many different forms by which a capacitance is provided between the interface of a slave device and the signal line.

What is claimed is:

1. An integrated circuit memory comprising:
an output driver circuit to provide data to an external signal line;
a first diode device having an anode that couples to the external signal line and cathode coupled to a terminal of the output driver circuit, wherein the first diode element is forward biased when the output driver circuit provides the data onto the external signal line by sourcing current;
a second diode device having an anode coupled to the terminal of the output driver circuit and a cathode that couples to the external signal line, wherein the second diode element is reverse biased when the output driver circuit provides the data onto the external signal line by sinking current; and,
an input receiver coupled to the terminal, to receive delay modulated data transmitted to the integrated circuit device via the external signal line.

2. An integrated circuit memory device comprising:
an output driver circuit to provide data to an external signal line;
a first diode device having an anode that couples to the external signal line and a cathode coupled to a terminal of the output driver circuit, wherein the first diode element is forward biased when the output driver circuit provides the data onto the external signal line by sourcing current;
a second diode device having an anode coupled to the terminal of the output driver circuit and a cathode that couples to the external signal line, wherein the second diode element is reverse biased when the output driver circuit provides the data onto the external signal line by sinking current; and,
an input receiver coupled to the terminal, to receive delay modulated data transmitted to the integrated circuit device via the external signal line,
wherein the delay modulated data includes first and second data bits, and where a logic state of the first data bit is represented by a first signal level transition during a first bit period and a logic state of the second data bit is represented by an absence of a signal level transition during a second bit period.

3. An integrated circuit memory device comprising:
an output driver circuit to provide data to an external signal line;
a first diode device having an anode that couples to the external signal line and a cathode coupled to a terminal of the output driver circuit, wherein the first diode element is forward biased when the output driver circuit provides the data onto the external signal line by sourcing current;
a second diode device having an anode coupled to the terminal of the output driver circuit and a cathode that couples to the external signal line, wherein the second diode element is reverse biased when the output driver circuit provides the data onto the external signal line by sinking current; and,
an input receiver coupled to the terminal, to receive delay modulated data transmitted to the integrated circuit device via the external signal line,
wherein the delay modulated data includes first and second data bits, and wherein a logic state of the first data bit is represented by a first signal level transition during a first bit period and a logic state of the second data bit is represented by an absence of a signal level transition during a second bit period,
wherein the logic state of the first data bit is different than the logic state of the second data bit.

4. An integrated circuit memory device comprising:
an output driver circuit to provide data to an external signal line;
a first diode device having an anode that couples to the external signal line and cathode coupled to a terminal of the output driver circuit, wherein the first diode element is forward biased when the output driver circuit provides the data onto the external signal line by sourcing current;
a second diode device having an anode coupled to the terminal of the output driver circuit and a cathode that couples to the external signal line, wherein the second diode element is reverse biased when the output driver circuit provides the data onto the external signal line by sinking current; and,
an input receiver coupled to the terminal, to receive delay modulated data transmitted to the integrated circuit device via the external signal line,
wherein the delay modulated data includes first and second data bits, and wherein a logic state of the first data bit is represented by a first signal level transition during a first bit period and a logic state of the second data bit is represented by an absence of a signal level transition during a second bit period,
wherein the delay modulated data includes a third data bit in succession to the first and second data bits, wherein the third data bit is represented by a second signal level transition during a third bit period, and wherein the logic states of the second and third bits are the same.

5. An integrated circuit memory device comprising:
an output driver circuit to provide data to an external signal line;
a first diode device having an anode that couples to the external signal line and a cathode coupled to a terminal of the output driver circuit, wherein the first diode element is forward biased when the output driver circuit provides the data onto the external signal line by sourcing current;
a second diode device having an anode coupled to the terminal of the output driver circuit and a cathode that couples to the external signal line, wherein the second diode element is reverse biased when the output driver circuit provides the data onto the external signal line by sinking current; and,
an input receiver coupled to the terminal, to receive delay modulated data transmitted to the integrated circuit device via the external signal line,
wherein the delay modulated data includes first and second data bits, and wherein a logic state of the first data bit is represented by a first signal level transition during a first bit period and a logic state of the second data bit is represented by an absence of a signal level transition during a second bit period,
wherein the delay modulated data includes a third data bit in succession to the first and second data bits, wherein the third data bit is represented by a second signal level transition during a third bit period, and wherein the logic states of the second and third bits are the same,
wherein the first signal level transition occurs midway during the first bit period, and the third signal level transition occurs at the end of the second bit period.

6. A method of communicating with an integrated circuit device, wherein the integrated circuit device includes an input receiver to receive data via a capacitive coupling element, the method comprising:

receiving first and second data bits in succession wherein, the first and second data bits are received during respective first and second bit periods;

decoding the first data bit to determine a logic state of the first data bit, wherein the first data bit is:

a first logic state when a signal level transitions during the first bit period; and a second logic state when there is an absence of any signal level transition during the first bit period; and decoding the second data bit wherein the second data bit is:

the second logic state when the signal level transitions at the end of the first bit period and the first data bit is the first logic state; and the first logic state when the signal level transitions during the second bit period.

7. The method of claim 6 wherein the first and second data bits are delay modulated.

8. The method of claim 6 wherein the capacitive coupling element operates in a reverse bias state to thereby capacitively couple the delay modulated data from the external signal line to the input receiver.

9. The method of claim 6 further including driving data onto an external signal line via the capacitive coupling element.

10. The method of claim 9 wherein the capacitive coupling element includes a diode element that operates in a forward biased state when the driver provides data onto the external signal line to thereby directly couple the output driver to the external signal line.

* * * * *

UNITED STATES PATENT AND TRADEMARK OFFICE
CERTIFICATE OF CORRECTION

PATENT NO.        : 6,854,030 B2                                          Page 1 of 1
APPLICATION NO. : 10/287100
DATED             : February 8, 2005
INVENTOR(S)       : Perino et al.

It is certified that error appears in the above-identified patent and that said Letters Patent is hereby corrected as shown below:

Column 17, line 40: After "and" and before "a" delete "where" and substitute -- wherein --

Signed and Sealed this

Fifth Day of December, 2006

JON W. DUDAS
*Director of the United States Patent and Trademark Office*